(12) United States Patent
Kamiya et al.

(10) Patent No.: US 12,439,699 B2
(45) Date of Patent: Oct. 7, 2025

(54) SEMICONDUCTOR MEMORY DEVICE

(71) Applicant: Kioxia Corporation, Tokyo (JP)

(72) Inventors: Yuta Kamiya, Nagoya Aichi (JP);
Kazuhiro Matsuo, Kuwana Mie (JP);
Kota Takahashi, Yokkaichi Mie (JP);
Masaya Toda, Yokkaichi Mie (JP);
Tomoki Ishimaru, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 717 days.

(21) Appl. No.: 17/687,379

(22) Filed: Mar. 4, 2022

(65) Prior Publication Data

US 2023/0088864 A1    Mar. 23, 2023

(30) Foreign Application Priority Data

Sep. 17, 2021    (JP) .................. 2021-151984

(51) Int. Cl.
*H10D 88/00*    (2025.01)
*H10B 12/00*    (2023.01)
*H10D 1/68*    (2025.01)
*H10D 30/67*    (2025.01)

(52) U.S. Cl.
CPC ............. *H10D 88/00* (2025.01); *H10B 12/03* (2023.02); *H10B 12/05* (2023.02); *H10D 1/692* (2025.01); *H10D 30/6728* (2025.01); *H10D 30/6755* (2025.01); *H10B 12/31* (2023.02); *H10B 12/33* (2023.02)

(58) Field of Classification Search
CPC .......... H10D 88/00–01; H10D 30/6728; H10B 12/31; H10B 12/33
See application file for complete search history.

(56) References Cited

U.S. PATENT DOCUMENTS

| 6,793,969 B2 | 9/2004 | Shimogaki et al. |
| 7,132,710 B2 | 11/2006 | Baik et al. |
| 9,012,292 B2 * | 4/2015 | Lee ................ H10B 12/31 |
| | | 257/E21.09 |

(Continued)

FOREIGN PATENT DOCUMENTS

| JP | 2003-226972 A | 8/2003 |
| JP | 2005-136414 A | 5/2005 |

(Continued)

*Primary Examiner* — Daniel Luke
(74) *Attorney, Agent, or Firm* — Foley & Lardner LLP

(57) ABSTRACT

A semiconductor memory device according to an embodiment includes: a first oxide semiconductor layer between a first conductive layer and a second conductive layer; a first gate electrode; a first electrode; a second electrode; a first capacitor insulating film between the first electrode and the second electrode including a first region and a second region between the first region and the second electrode, concentration of the Ti is higher in the second region than the first region; a third conductive layer; a second oxide semiconductor layer between the third conductive layer and a fourth conductive layer; a second gate electrode; a third electrode; a fourth electrode; and a second capacitor insulating film between the third electrode and the fourth electrode, and including a third region and a fourth region between the third region and the fourth electrode, concentration of Ti is higher in the fourth region than the third region.

10 Claims, 26 Drawing Sheets

(56) References Cited

U.S. PATENT DOCUMENTS

| | | | |
|---|---|---|---|
| 9,698,272 B1 * | 7/2017 | Ikeda | .................... H10D 86/481 |
| 11,502,204 B2 * | 11/2022 | Gawase | ............. H10D 30/6755 |
| 2020/0381557 A1 * | 12/2020 | Hattori | ............... H10D 30/6755 |
| 2021/0082921 A1 | 3/2021 | Wada et al. | |

FOREIGN PATENT DOCUMENTS

| | | |
|---|---|---|
| JP | 4074461 B2 | 4/2008 |
| JP | 2021-044526 A | 3/2021 |

\* cited by examiner

AA' CROSS-SECTION

BB' CROSS-SECTION

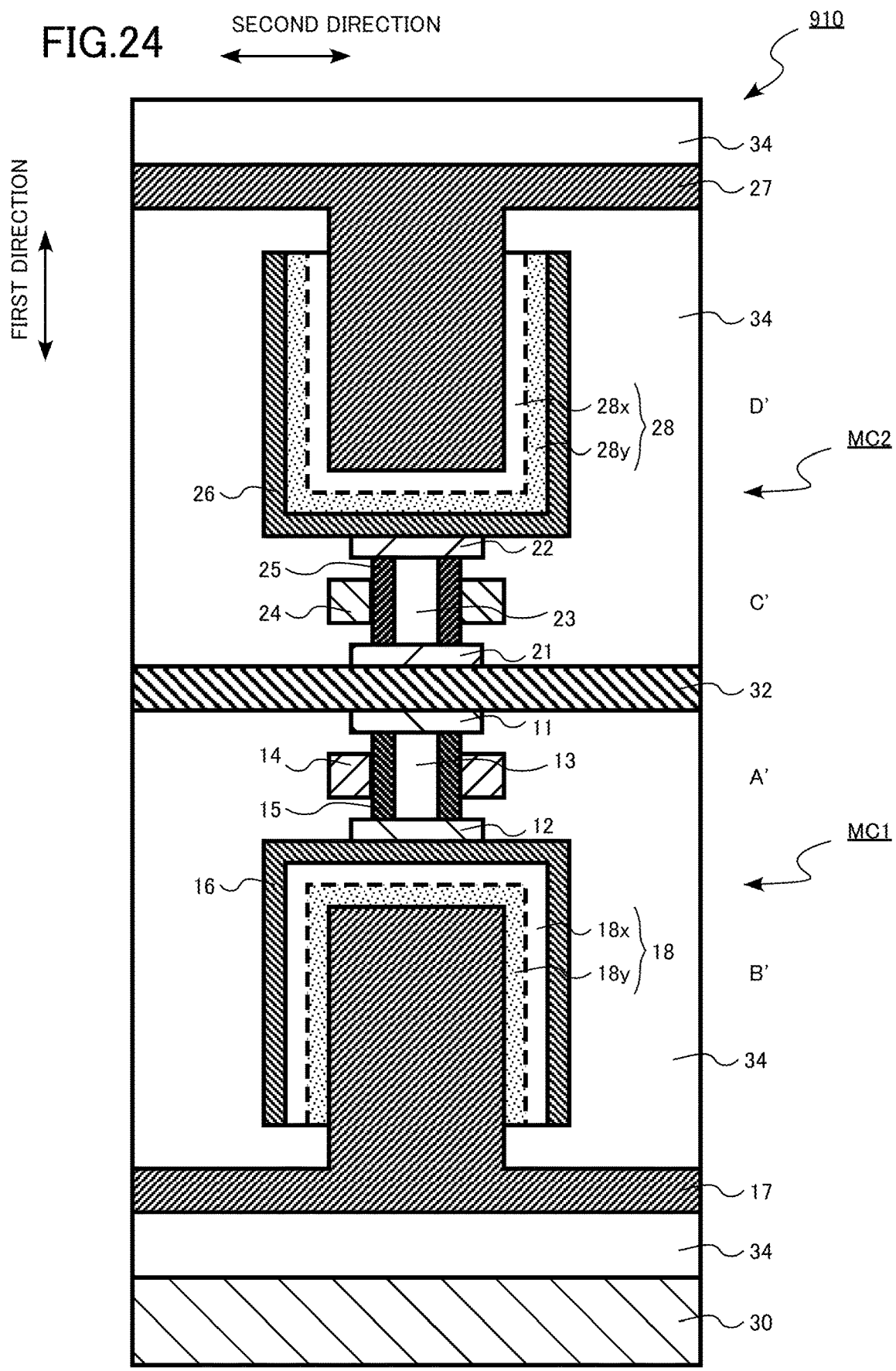

SEMICONDUCTOR MEMORY DEVICE

CROSS-REFERENCE TO RELATED APPLICATION

This application is based upon and claims the benefit of priority from Japanese Patent Application No. 2021-151984, filed on Sep. 17, 2021, the entire contents of which are incorporated herein by reference.

FIELD

Embodiments described herein relate generally to a semiconductor memory device.

BACKGROUND

An oxide semiconductor transistor, in which a channel is formed in an oxide semiconductor layer, has an excellent characteristic that a channel leakage current during an off operation, that is, an off-leak current is extremely small. Therefore, for example, applying the oxide semiconductor transistor to a switching transistor of a memory cell of a dynamic random access memory (DRAM) has been studied. By applying the oxide semiconductor transistor to a switching transistor of a DRAM, charge storage characteristic of a memory cell is improved.

In a case where the oxide semiconductor transistor is applied to the switching transistor of the memory cell, it is desired to reduce a leakage current of a capacitor insulating film of a storage capacitor of the memory cell. The leakage current of the capacitor insulating film is reduced, and thus the charge storage characteristic of the memory cell is improved.

BRIEF DESCRIPTION OF THE DRAWINGS

FIG. 24 is an enlarged schematic cross-sectional view of a memory cell array of a semiconductor memory device according to a comparative example;

DETAILED DESCRIPTION

Figure 1:
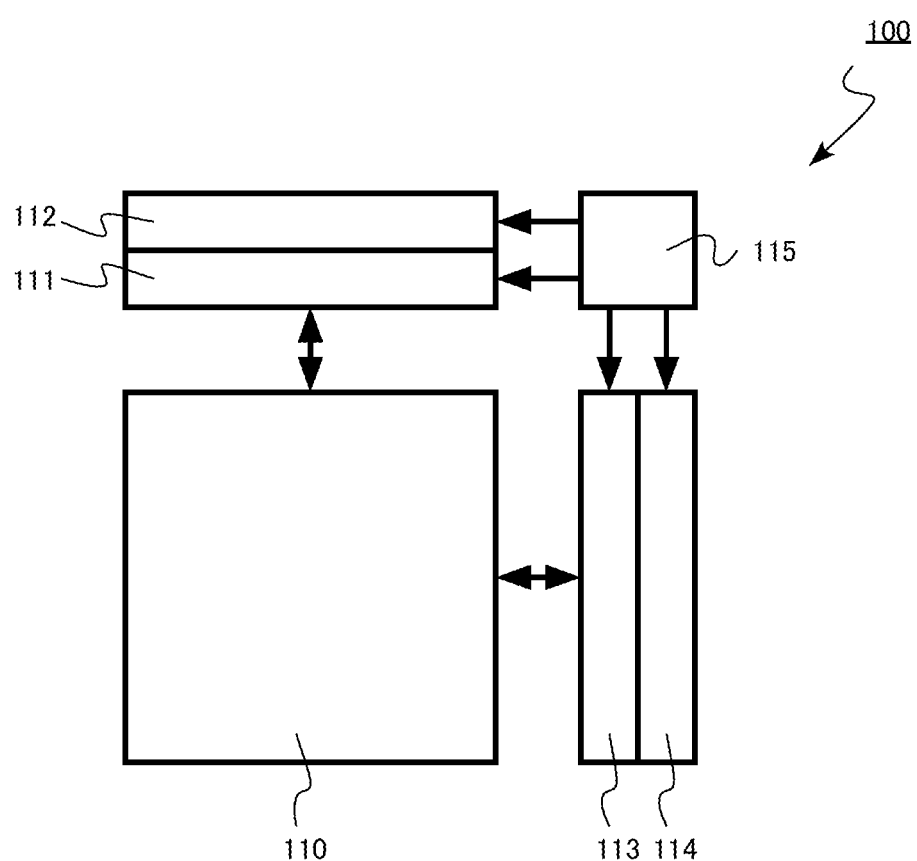
FIG. 1 is a block diagram of a semiconductor memory device according to a first embodiment.

A semiconductor memory device according to the embodiment includes: a first conductive layer; a second conductive layer; a first oxide semiconductor layer provided between the first conductive layer and the second conductive layer; a first gate electrode surrounding the first oxide semiconductor layer; a first gate insulating film provided between the first oxide semiconductor layer and the first gate electrode; a first electrode provided in a first direction with respect to the second conductive layer, the first direction being a direction connecting the first conductive layer and the second conductive layer, the second conductive layer provided between the first oxide semiconductor layer and the first electrode, the first electrode electrically connected to the second conductive layer, and the first electrode containing titanium (Ti); a second electrode surrounding the first electrode and containing the titanium (Ti); a first capacitor insulating film provided between the first electrode and the second electrode, the first capacitor insulating film including a first region and a second region between the first region and the second electrode, an atomic concentration of the titanium (Ti) of the second region being higher than an atomic concentration of the titanium (Ti) of the first region; a third conductive layer provided in the first direction with respect to the first conductive layer, the third conductive layer electrically connected to the first conductive layer; a fourth conductive layer provided in the first direction with respect to the third conductive layer, the third conductive layer provided between the first conductive layer and the fourth conductive layer; a second oxide semiconductor layer provided between the third conductive layer and the fourth conductive layer; a second gate electrode surrounding the second oxide semiconductor layer; a second gate insulating film provided between the second oxide semiconductor layer and the second gate electrode; a third electrode provided in the first direction with respect to the fourth conductive layer, the fourth conductive layer provided between the second oxide semiconductor layer and the third electrode, the third electrode electrically connected to the fourth conductive layer, and the third electrode containing the titanium (Ti); a fourth electrode surrounding the third electrode and containing the titanium (Ti); and a second capacitor insulating film provided between the third electrode and the fourth electrode, the second capacitor insulating film including a third region and a fourth region between the third region and the fourth electrode, an atomic concentration of the titanium (Ti) of the fourth region being higher than an atomic concentration of the titanium (Ti) of the third region.

Hereinafter, embodiments of the present disclosure will be described with reference to the drawings. In the following description, the same or similar members are denoted by the same reference numerals, and the description of the members described once is appropriately omitted.

In the present specification, the term "upper" or "lower" may be used for convenience. The "upper" or the "lower" is merely a term indicating a relative positional relationship in the drawings, and is not a term defining a positional relationship with respect to gravity.

Qualitative analysis and quantitative analysis of chemical compositions of members constituting the semiconductor memory device in the present specification can be performed by, for example, secondary ion mass spectrometry (SIMS), energy dispersive X-ray spectroscopy (EDX), or rutherford back-scattering spectroscopy (RBS). For example, a transmission electron microscope (TEM) can be used for measuring a thickness of the members constituting the semiconductor memory device, a distance between the members, and the like.

First Embodiment

A semiconductor memory device according to the first embodiment includes: a first conductive layer; a second conductive layer; a first oxide semiconductor layer provided between the first conductive layer and the second conductive layer; a first gate electrode surrounding the first oxide semiconductor layer; a first gate insulating film provided between the first oxide semiconductor layer and the first gate electrode; a first electrode provided in a first direction connecting the first conductive layer and the second conductive layer with respect to the second conductive layer, electrically connected to the second conductive layer, and containing titanium (Ti); a second electrode surrounding the first electrode and containing the titanium (Ti); a first capacitor insulating film provided between the first electrode and the second electrode, and including a first region and a second region between the first region and the second electrode, the first capacitor insulating film having an atomic concentration of the titanium (Ti) of the second region higher than an atomic concentration of the titanium (Ti) of the first region; a third conductive layer electrically connected to the first conductive layer; a fourth conductive layer provided in the first direction with respect to the third conductive layer; a second oxide semiconductor layer provided between the third conductive layer and the fourth conductive layer; a second gate electrode surrounding the second oxide semiconductor layer; a second gate insulating film provided between the second oxide semiconductor layer and the second gate electrode; a third electrode provided in the first direction with respect to the fourth conductive layer, electrically connected to the fourth conductive layer, and containing the titanium (Ti); a fourth electrode surrounding the third electrode and containing the titanium (Ti); and a second capacitor insulating film provided between the third electrode and the fourth electrode, and including a third region and a fourth region between the third region and the fourth electrode, the second capacitor insulating film having an atomic concentration of the titanium (Ti) of the fourth region higher than an atomic concentration of the titanium (Ti) of the third region.

The semiconductor memory device of the first embodiment is a semiconductor memory 100. The semiconductor memory device of the first embodiment is a DRAM. In the semiconductor memory 100, an oxide semiconductor transistor is applied to a switching transistor of a memory cell.

FIG. 1 is a block diagram of the semiconductor memory device according to the first embodiment.

As illustrated in FIG. 1, the semiconductor memory 100 includes a memory cell array 110, a word line driver circuit 111, a row decoder circuit 112, a sense amplifier circuit 113, a column decoder circuit 114, and a control circuit 115.

Figure 2:
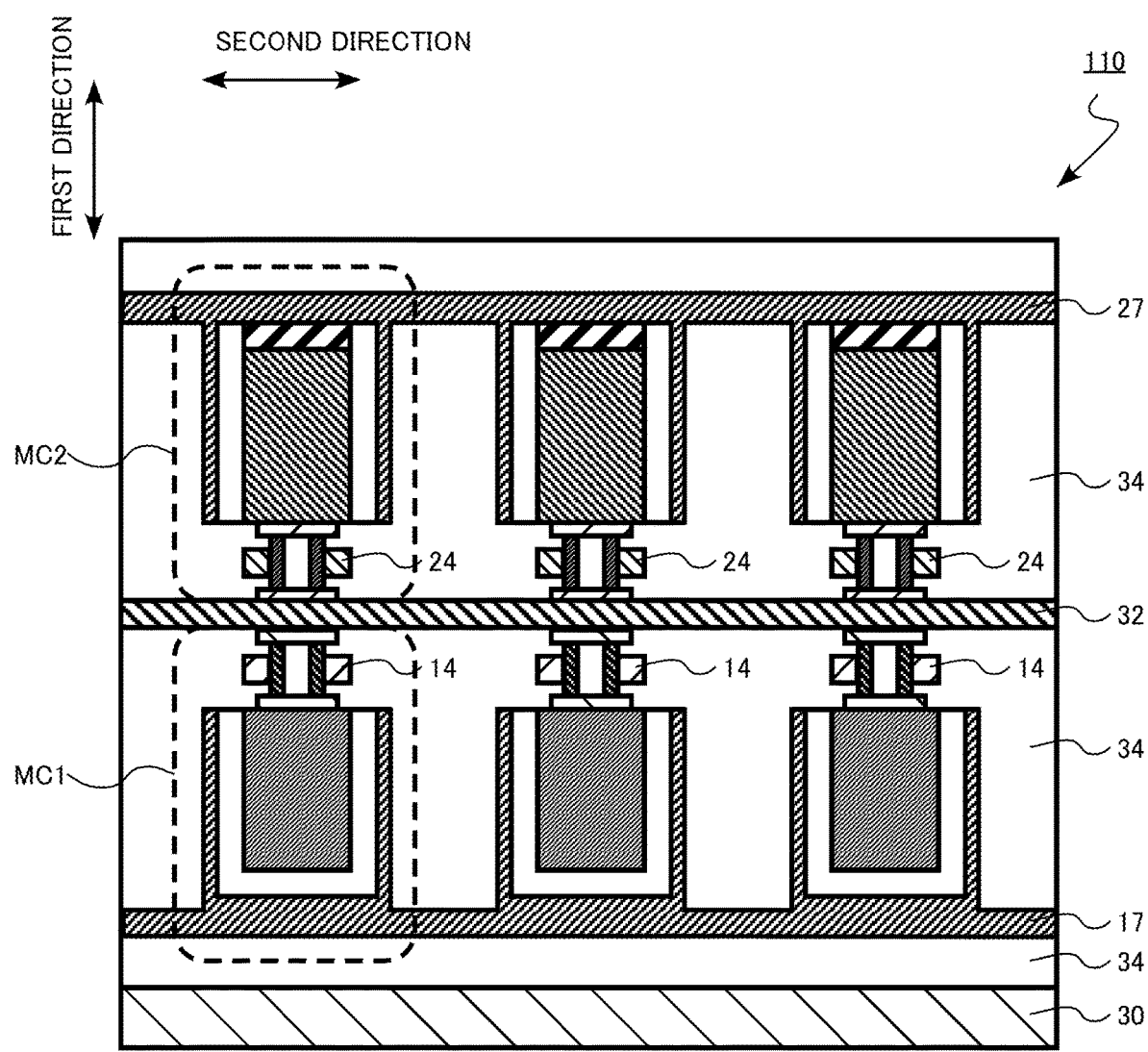
FIG. 2 is a schematic cross-sectional view of a memory cell array of the semiconductor memory device according to the first embodiment.
Figure 3:
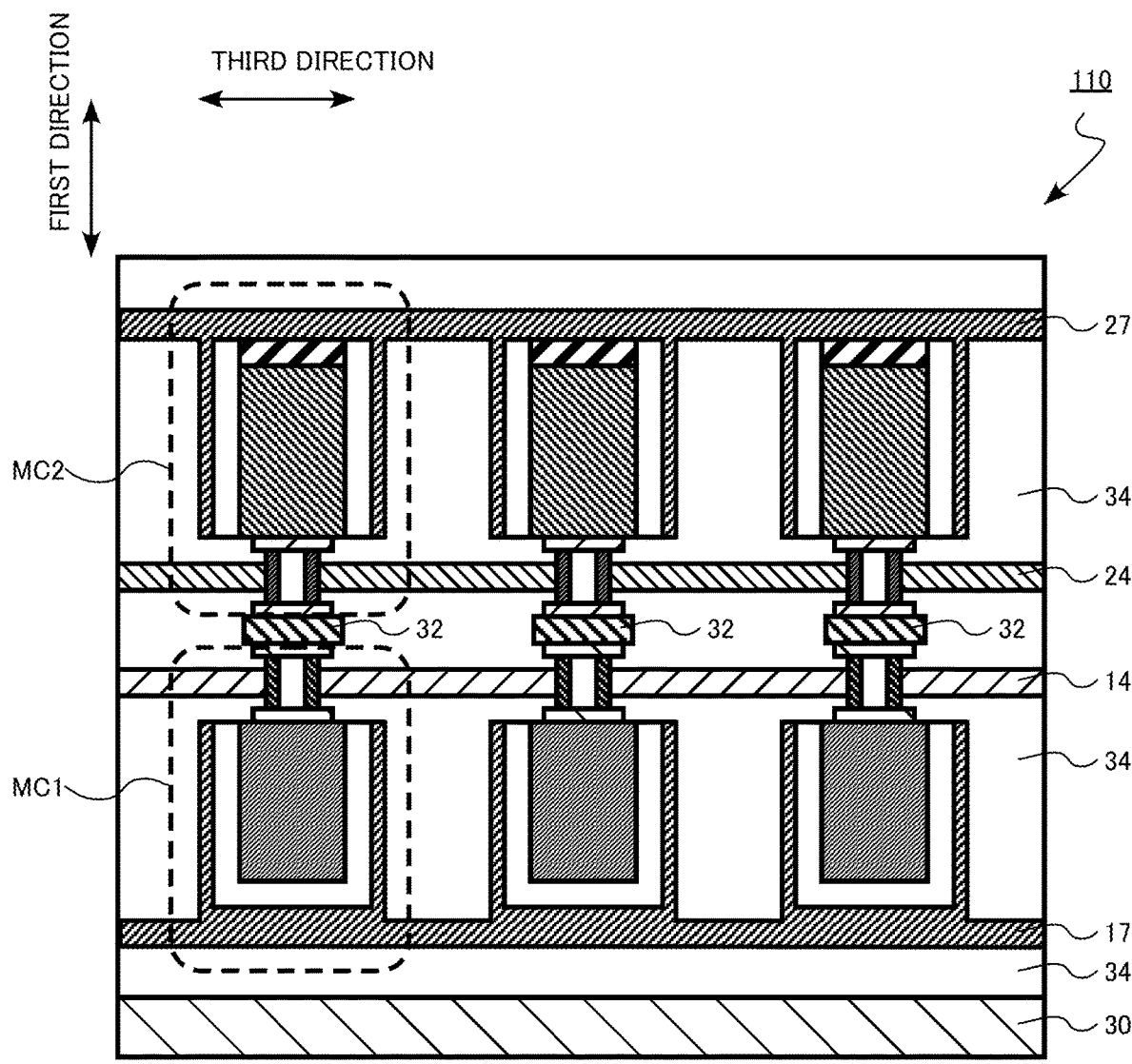
FIG. 3 is a schematic cross-sectional view of a memory cell array of the semiconductor memory device according to the first embodiment.

FIGS. 2 and 3 are schematic cross-sectional views of the memory cell array of the semiconductor memory device according to the first embodiment. FIG. 2 is a cross-sectional view of a plane including a first direction and a second direction, and FIG. 3 is a cross-sectional view of a plane including the first direction and a third direction. The first direction is, for example, a vertical direction of FIGS. 2 and 3. The second direction and the first direction intersect with each other. The second direction is, for example, a horizontal direction of FIGS. 2 and 3. The first direction is, for example, perpendicular to the second direction. The third direction intersects with the first direction and the second direction. The third direction is, for example, perpendicular to the first direction and the second direction.

The memory cell array 110 of the first embodiment has a three-dimensional structure in which the memory cells are three-dimensionally disposed. The memory cell array 110 includes a first memory cell MC1 and a second memory cell MC2.

Figure 4:
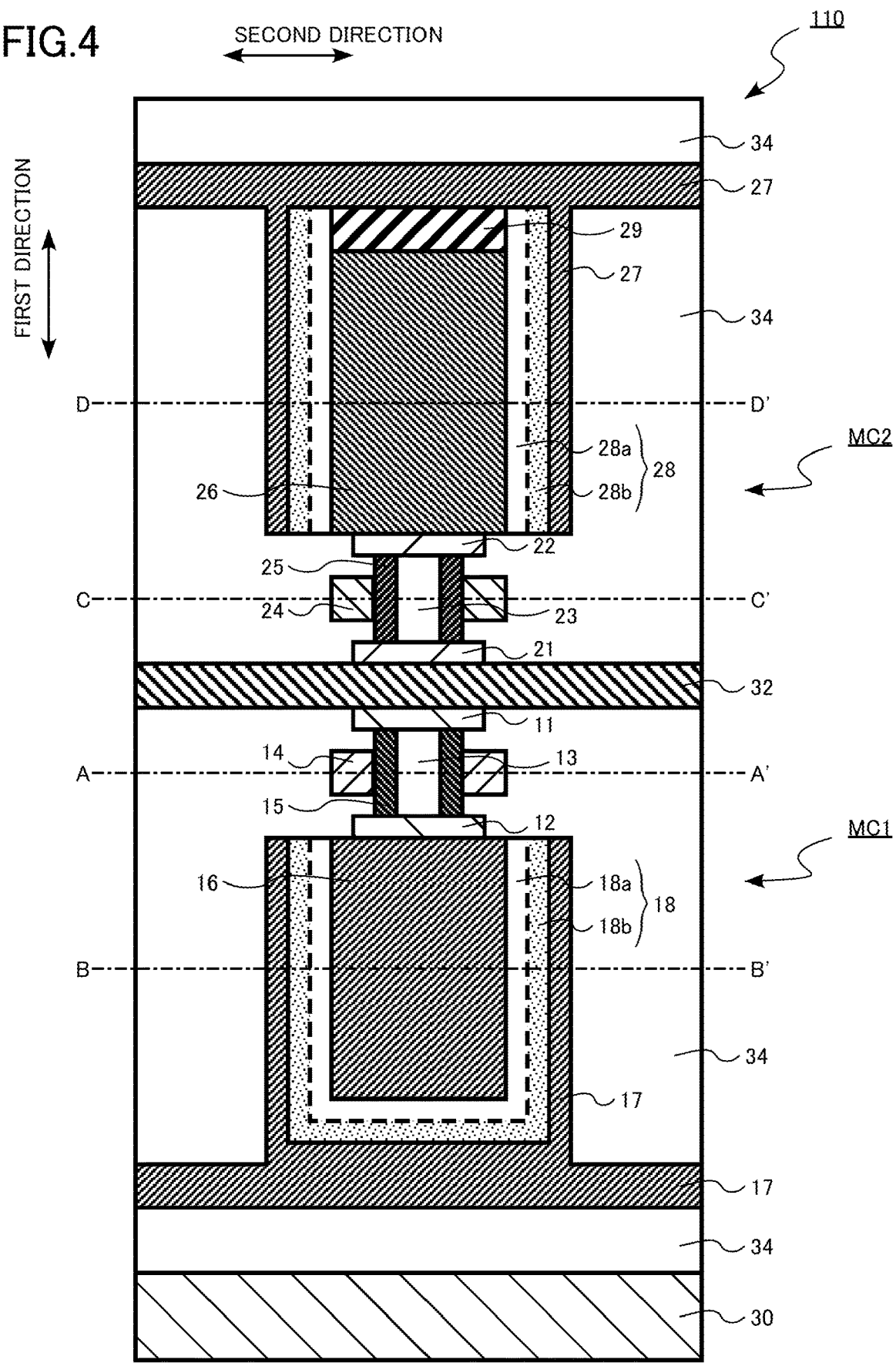
FIG. 4 is an enlarged schematic cross-sectional view of a memory cell array of the semiconductor memory device according to the first embodiment.

FIGS. 4, 5A, 5B, 6A, and 6B are enlarged schematic cross-sectional views of the memory cell array of the semiconductor memory device according to the first embodiment. FIG. 4 is a cross-sectional view including the first memory cell MC1 and the second memory cell MC2.

Figure 5A:
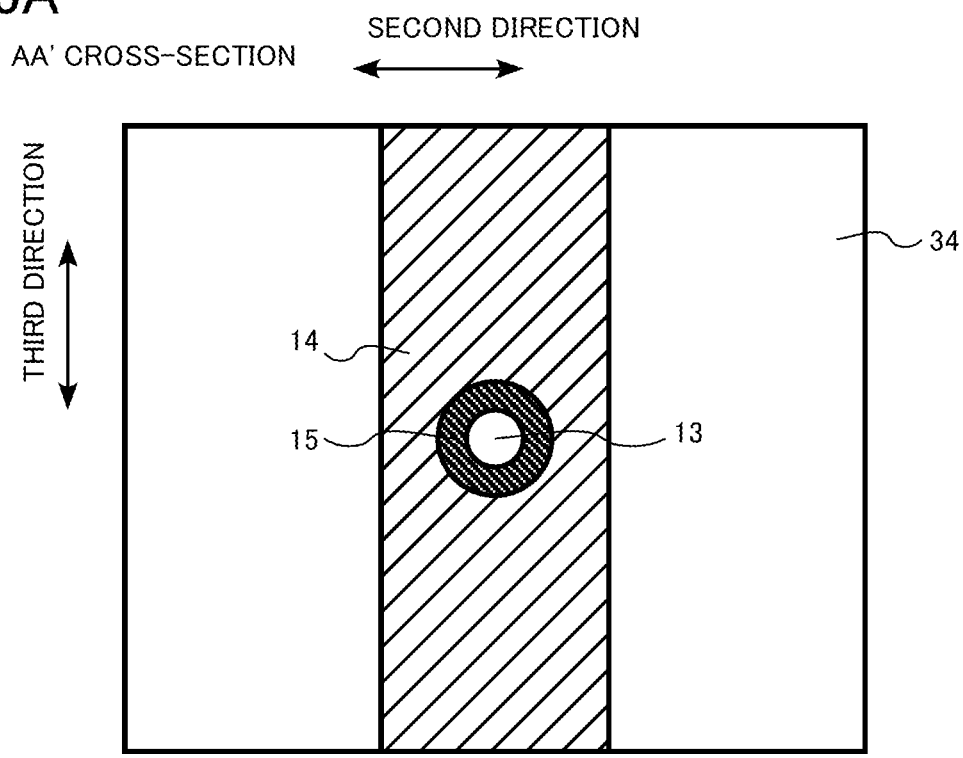
FIGS. 5A and 5B are enlarged schematic cross-sectional views of a memory cell array of the semiconductor memory device according to the first embodiment.
Figure 5B:
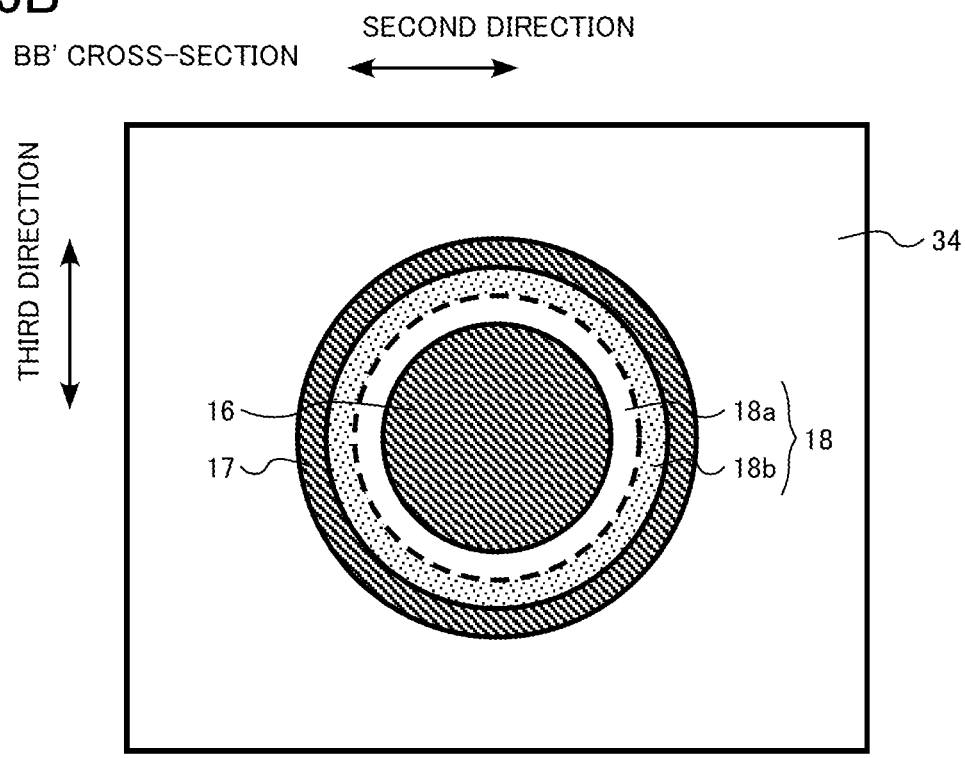

FIGS. 5A and 5B are cross-sectional views of the first memory cell MC1. FIG. 5A is a cross-sectional view taken along line A-A' of FIG. 4. FIG. 5B is a cross-sectional view taken along line B-B' of FIG. 4.

Figure 6A:
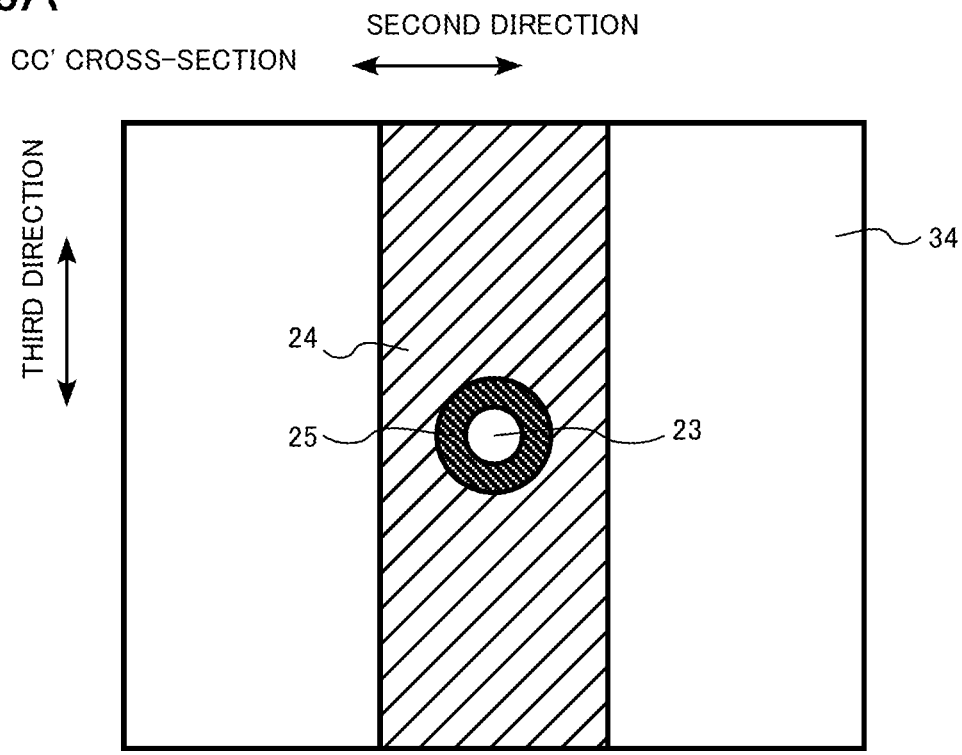
FIGS. 6A and 6B are enlarged schematic cross-sectional views of a memory cell array of the semiconductor memory device according to the first embodiment.
Figure 6B:
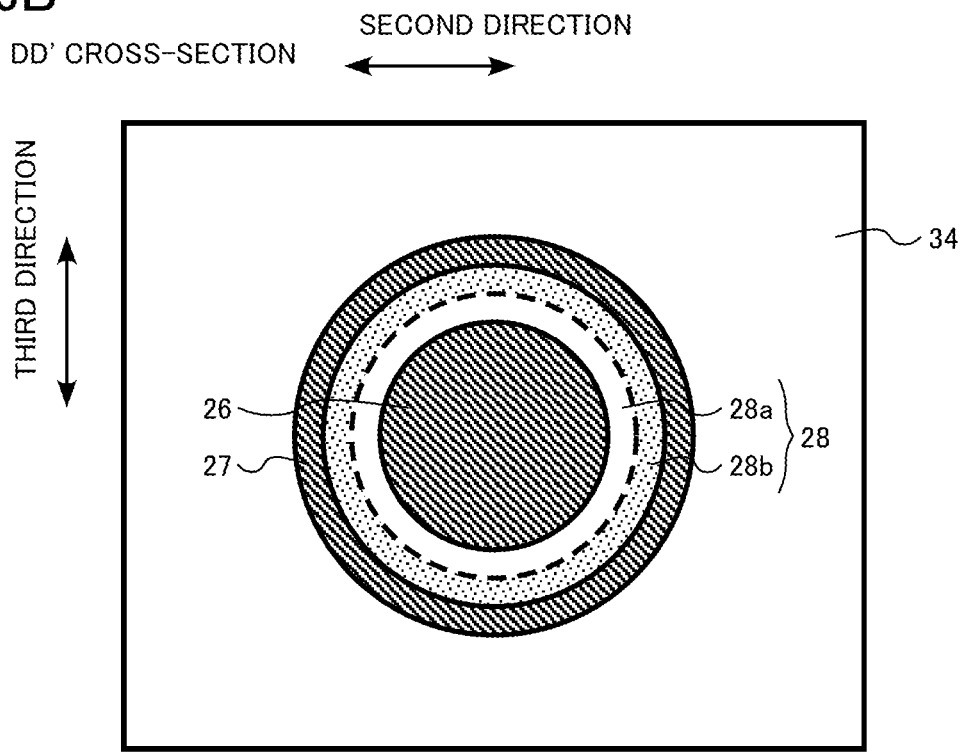

FIGS. 6A and 6B are cross-sectional views of the second memory cell MC2. FIG. 6A is a cross-sectional view taken along line C-C' of FIG. 4. FIG. 6B is a cross-sectional view taken along line D-D' of FIG. 4.

The first memory cell MC1 includes a first source electrode 11, a first drain electrode 12, a first oxide semiconductor layer 13, a first gate electrode 14, a first gate insulating film 15, a first storage node electrode 16, a first plate electrode 17, and a first capacitor insulating film 18. The first capacitor insulating film 18 includes a first low-concentration region 18a and a first high-concentration region 18b.

The first source electrode 11 is an example of a first conductive layer. The first drain electrode 12 is an example of a second conductive layer. The first storage node electrode 16 is an example of a first electrode. The first plate electrode 17 is an example of a second electrode. The first low-concentration region 18a is an example of a first region. The first high-concentration region 18b is an example of a second region.

The second memory cell MC2 includes a second source electrode 21, a second drain electrode 22, a second oxide semiconductor layer 23, a second gate electrode 24, a second gate insulating film 25, a second storage node electrode 26, a second plate electrode 27, a second capacitor insulating film 28, an insulating layer 29. The second capacitor insulating film 28 includes a second low-concentration region 28a and a second high-concentration region 28b.

The second source electrode 21 is an example of a third conductive layer. The second drain electrode 22 is an example of a fourth conductive layer. The second storage node electrode 26 is an example of a third electrode. The second plate electrode 27 is an example of a fourth electrode. The second low-concentration region 28a is an example of a third region. The second high-concentration region 28b is an example of a fourth region.

The memory cell array 110 includes a silicon substrate 30, a wiring layer 32, and an interlayer insulating layer 34. The silicon substrate 30 is an example of a substrate.

In the memory cell array 110, a plurality of the wiring layers 32, a plurality of the first gate electrodes 14, and a plurality of the second gate electrodes 24 are provided on the silicon substrate 30. The wiring layer 32 extends in the second direction. The first gate electrode 14 and the second gate electrode 24 extend in the third direction.

A plurality of the wiring layers 32 function as bit lines of the semiconductor memory 100. A plurality of the first gate electrodes 14 and a plurality of the second gate electrodes 24 function as word lines of the semiconductor memory 100.

A plurality of the first gate electrodes 14 and a plurality of the second gate electrodes 24 are electrically connected to the row decoder circuit 112. A plurality of the wiring layers 32 are electrically connected to the sense amplifier circuit 113.

The row decoder circuit 112 has a function of selecting the first gate electrode 14 or the second gate electrode 24 according to an input row address signal. The word line driver circuit 111 has a function of applying a predetermined voltage to the first gate electrode 14 or the second gate electrode 24, which is selected by the row decoder circuit 112.

The column decoder circuit 114 has a function of selecting the wiring layer 32 according to an input column address signal. The sense amplifier circuit 113 has a function of applying a predetermined voltage to the wiring layer 32 selected by the column decoder circuit 114. The sense amplifier circuit 113 also has a function of detecting and amplifying an electric potential of the selected wiring layer 32.

The control circuit 115 has a function of controlling the word line driver circuit 111, the row decoder circuit 112, the sense amplifier circuit 113, the column decoder circuit 114, and other circuits (not illustrated).

Circuits such as the word line driver circuit 111, the row decoder circuit 112, the sense amplifier circuit 113, the column decoder circuit 114, and the control circuit 115 include, for example, transistors and wiring layers (not illustrated). The transistor is formed by using, for example, the silicon substrate 30.

The first memory cell MC1 is provided on the silicon substrate 30. The first memory cell MC1 is provided between the silicon substrate 30 and the second memory cell MC2.

The first memory cell MC1 includes a first source electrode 11, a first drain electrode 12, a first oxide semiconductor layer 13, a first gate electrode 14, a first gate insulating film 15, a first storage node electrode 16, a first plate electrode 17, and a first capacitor insulating film 18. The first capacitor insulating film 18 includes a first low-concentration region 18a and a first high-concentration region 18b.

The first source electrode 11, the first drain electrode 12, the first oxide semiconductor layer 13, the first gate electrode 14, and the first gate insulating film 15 constitute a switching transistor of the first memory cell MC1.

A direction connecting the first source electrode 11 and the first drain electrode 12 is the first direction.

The first source electrode 11 is a conductive layer. The first source electrode 11 is formed of, for example, metal or a metal compound. The first source electrode 11 contains, for example, indium (In), tin (Sn), and oxygen (O). The first source electrode 11 contains, for example, indium tin oxide.

The first drain electrode 12 is a conductive layer. The first drain electrode 12 is formed of, for example, metal or a metal compound. The first drain electrode 12 contains, for example, indium (In), tin (Sn), and oxygen (O). The first drain electrode 12 contains, for example, indium tin oxide.

The first oxide semiconductor layer 13 is provided between the first source electrode 11 and the first drain electrode 12.

In the first oxide semiconductor layer 13, a channel serving as a current path is formed when the switching transistor is turned on. The first oxide semiconductor layer 13 extends in the first direction. When the switching transistor is turned on, a current flows through the first oxide semiconductor layer 13 in the first direction.

The first oxide semiconductor layer 13 is an oxide semiconductor. The first oxide semiconductor layer 13 contains, for example, indium (In) and zinc (Zn). The first oxide semiconductor layer 13 contains, for example, indium (In), gallium (Ga), zinc (Zn), and oxygen (O).

The first oxide semiconductor layer 13 has, for example, a cylindrical column shape.

The first gate electrode 14 is provided to be opposed to the first oxide semiconductor layer 13. The first gate electrode 14 surrounds the first oxide semiconductor layer 13. The first gate electrode 14 is provided around the first oxide semiconductor layer 13.

The first gate electrode 14 is formed of, for example, metal, a metal compound, or a semiconductor. The first gate electrode 14 contains, for example, tungsten (W).

A length of the first gate electrode 14 in the first direction is, for example, equal to or more than 20 nm and equal to or less than 100 nm.

The first gate insulating film 15 is provided between the first oxide semiconductor layer 13 and the first gate electrode 14. The first gate insulating film 15 surrounds the first oxide semiconductor layer 13.

The first gate insulating film 15 is formed of, for example, an oxide or an oxynitride. The first gate insulating film 15 contains, for example, silicon oxide or aluminum oxide. A thickness of the first gate insulating film 15 is, for example, equal to or more than 2 nm and equal to or less than 10 nm.

The first storage node electrode 16, the first plate electrode 17, and the first capacitor insulating film 18 constitute a capacitor of the first memory cell MC1.

The first storage node electrode 16 is provided in a first direction with respect to the first drain electrode 12. The first storage node electrode 16 is provided between the first drain electrode 12 and the silicon substrate 30. The first storage node electrode 16 is electrically connected to the first drain electrode 12.

The first storage node electrode 16 is formed of a conductor. The first storage node electrode 16 is formed of, for example, metal or a metal compound.

The first storage node electrode 16 contains titanium (Ti). The first storage node electrode 16 contains, for example, titanium (Ti) and nitrogen (N). The first storage node electrode 16 contains, for example, titanium (Ti) and nitrogen (N) as main components. That the first storage node electrode 16 contains titanium (Ti) and nitrogen (N) as main components means that an element having an atomic concentration higher than that of the titanium (Ti) or the nitrogen (N) does not exist in the first storage node electrode 16. The first storage node electrode 16 contains, for example, titanium nitride. The first storage node electrode 16 is formed of, for example, titanium nitride.

The first storage node electrode 16 has, for example, a columnar shape. The first storage node electrode 16 has, for example, a cylindrical column shape.

The first plate electrode 17 is provided in the first direction of the first storage node electrode 16. The first plate electrode 17 is provided between the first storage node electrode 16 and the silicon substrate 30. The first plate electrode 17 surrounds the first storage node electrode 16. The first storage node electrode 16 is provided inside the first plate electrode 17.

The first plate electrode 17 is formed of a conductor. The first plate electrode 17 is formed of, for example, metal or a metal compound.

The first plate electrode 17 contains titanium (Ti). The first plate electrode 17 contains, for example, titanium (Ti) and nitrogen (N). The first plate electrode 17 contains, for example, titanium (Ti) and nitrogen (N) as main components. That the first plate electrode 17 contains titanium (Ti) and nitrogen (N) as main components means that an element having an atomic concentration higher than that of the titanium (Ti) or the nitrogen (N) does not exist in the first plate electrode 17. The first plate electrode 17 contains, for example, titanium nitride. The first plate electrode 17 is formed of, for example, titanium nitride.

The first plate electrode 17 has, for example, a cylindrical shape.

The first capacitor insulating film 18 is provided between the first storage node electrode 16 and the first plate electrode 17. The first capacitor insulating film 18 includes the first low-concentration region 18a and the first high-concentration region 18b. The first high-concentration region 18b is provided between the first low-concentration region 18a and the first plate electrode 17.

An atomic concentration of titanium (Ti) of the first high-concentration region 18b is higher than the atomic concentration of the titanium (Ti) of the first low-concentration region 18a. The atomic concentration of the titanium (Ti) of the first high-concentration region 18b is equal to or more than ten times the atomic concentration of the titanium (Ti) of the first low-concentration region 18a. The atomic concentration of the titanium (Ti) of the first high-concentration region 18b is, for example, equal to or more than $1 \times 10^{17}$ cm$^{-3}$ and equal to or less than $1 \times 10^{20}$ cm$^{-3}$.

The first capacitor insulating film 18 is formed of, for example, a metal oxide. The first capacitor insulating film 18 contains, for example, at least one metal element selected from the group consisting of zirconium (Zr), hafnium (Hf), aluminum (Al), yttrium (Y), lanthanum (La), and tantalum (Ta), and oxygen (O).

The first capacitor insulating film 18 contains, for example, zirconium oxide, hafnium oxide, hafnium silicate, aluminum oxide, yttrium oxide, lanthanum oxide, or tantalum oxide. The first capacitor insulating film 18 is formed of, for example, zirconium oxide, hafnium oxide, hafnium silicate, aluminum oxide, yttrium oxide, lanthanum oxide, or tantalum oxide. The first capacitor insulating film 18 is, for example, a stacked film formed by stacking zirconium oxide, aluminum oxide, and zirconium oxide in this order.

A thickness of the first capacitor insulating film 18 is, for example, equal to or more than 1 nm and equal to or less than 20 nm. The thickness of the first capacitor insulating film 18 in the second direction is, for example, equal to or more than 1 nm and equal to or less than 20 nm. The thickness of the first capacitor insulating film 18 in the first direction is, for example, equal to or more than 1 nm and equal to or less than 20 nm.

The second memory cell MC2 is provided on the silicon substrate 30. The second memory cell MC2 is provided on the first memory cell MC1. The second memory cell MC2 is provided with the first memory cell MC1 interposed between the silicon substrate 30 and the second memory cell MC2.

The second memory cell MC2 includes a second source electrode 21, a second drain electrode 22, a second oxide semiconductor layer 23, a second gate electrode 24, a second gate insulating film 25, a second storage node electrode 26, a second plate electrode 27, a second capacitor insulating film 28, an insulating layer 29. The second capacitor insulating film 28 includes a second low-concentration region 28a and a second high-concentration region 28b.

The second source electrode 21, the second drain electrode 22, the second oxide semiconductor layer 23, the second gate electrode 24, and the second gate insulating film 25 constitute a switching transistor of the second memory cell MC2.

A direction from the second source electrode 21 toward the second drain electrode 22 is the first direction.

The second source electrode 21 is a conductive layer. The second source electrode 21 is formed of, for example, metal or a metal compound. The second source electrode 21 contains, for example, indium (In), tin (Sn), and oxygen (O). The second source electrode 21 contains, for example, indium tin oxide.

The second drain electrode 22 is a conductive layer. The second drain electrode 22 is formed of, for example, metal or a metal compound. The second drain electrode 22 contains, for example, indium (In), tin (Sn), and oxygen (O). The second drain electrode 22 contains, for example, indium tin oxide.

The second oxide semiconductor layer 23 is provided between the second source electrode 21 and the second drain electrode 22.

In the second oxide semiconductor layer 23, a channel serving as a current path is formed when the switching transistor is turned on. The second oxide semiconductor layer 23 extends in the first direction. When the switching transistor is turned on, a current flows through the second oxide semiconductor layer 23 in the first direction.

The second oxide semiconductor layer 23 is an oxide semiconductor. The second oxide semiconductor layer 23 contains, for example, indium (In), and zinc (Zn). The second oxide semiconductor layer 23 contains, for example, indium (In), gallium (Ga), zinc (Zn), and oxygen (O).

The second oxide semiconductor layer 23 has, for example, a cylindrical column shape.

The second gate electrode 24 is provided to be opposed to the second oxide semiconductor layer 23. The second gate electrode 24 surrounds the second oxide semiconductor layer 23. The second gate electrode 24 is provided around the second oxide semiconductor layer 23.

The second gate electrode 24 is formed of, for example, metal, a metal compound, or a semiconductor. The second gate electrode 24 contains, for example, tungsten (W).

A length of the second gate electrode 24 in the first direction is, for example, equal to or more than 20 nm and equal to or less than 100 nm.

The second gate insulating film 25 is provided between the second oxide semiconductor layer 23 and the second gate electrode 24. The second gate insulating film 25 surrounds the second oxide semiconductor layer 23.

The second gate insulating film 25 is formed of, for example, an oxide or an oxynitride. The second gate insulating film 25 contains, for example, silicon oxide or aluminum oxide. A thickness of the second gate insulating film 25 is, for example, equal to or more than 2 nm and equal to or less than 10 nm.

The second storage node electrode 26, the second plate electrode 27, and the second capacitor insulating film 28 constitute a capacitor of the second memory cell MC2.

The second storage node electrode 26 is provided in the first direction with respect to the second drain electrode 22. The second storage node electrode 26 is electrically connected to the second drain electrode 22.

The second storage node electrode 26 is formed of a conductor. The second storage node electrode 26 is formed of, for example, metal or a metal compound.

The second storage node electrode 26 contains titanium (Ti). The second storage node electrode 26 contains, for example, titanium (Ti) and nitrogen (N). The second storage node electrode 26 contains, for example, titanium (Ti) and nitrogen (N) as main components. That the second storage node electrode 26 contains titanium (Ti) and nitrogen (N) as main components means that an element having an atomic concentration higher than that of the titanium (Ti) or the nitrogen (N) does not exist in the second storage node electrode 26. The second storage node electrode 26 contains, for example, titanium nitride. The second storage node electrode 26 is formed of, for example, titanium nitride.

The second storage node electrode 26 has, for example, a columnar shape. The second storage node electrode 26 has, for example, a cylindrical column shape.

The second plate electrode 27 is provided in the first direction of the second storage node electrode 26. The second plate electrode 27 is provided with the second storage node electrode 26 interposed between the silicon substrate 30 and the second plate electrode 27. The second plate electrode 27 surrounds the second storage node electrode 26. The second storage node electrode 26 is provided inside the second plate electrode 27.

The second plate electrode 27 is formed of a conductor. The second plate electrode 27 is formed of, for example, metal or a metal compound.

The second plate electrode 27 contains titanium (Ti). The second plate electrode 27 contains, for example, titanium (Ti) and nitrogen (N). The second plate electrode 27 contains, for example, titanium (Ti) and nitrogen (N) as main components. That the second plate electrode 27 contains titanium (Ti) and nitrogen as main components means that an element having an atomic concentration higher than that of the titanium (Ti) or the nitrogen (N) does not exist in the second plate electrode 27. The second plate electrode 27 contains, for example, titanium nitride. The first plate electrode 17 is formed of, for example, titanium nitride.

The second plate electrode 27 has, for example, a cylindrical shape.

The second capacitor insulating film 28 is provided between the second storage node electrode 26 and the second plate electrode 27. The first capacitor insulating film 18 is provided between the silicon substrate 30 and the second capacitor insulating film 28.

The second capacitor insulating film 28 includes the second low-concentration region 28a and the second high-concentration region 28b. The second high-concentration region 28b is provided between the second low-concentration region 28a and the second plate electrode 27.

An atomic concentration of titanium (Ti) of the second high-concentration region 28b is higher than the atomic concentration of the titanium (Ti) of the second low-concentration region 28a. The atomic concentration of the titanium (Ti) of the second high-concentration region 28b is equal to or more than ten times the atomic concentration of the titanium (Ti) of the second low-concentration region 28a. The atomic concentration of the titanium (Ti) of the second high-concentration region 28b is, for example, equal to or more than $1 \times 10^{17}$ cm$^{-3}$ and equal to or less than $1 \times 10^{20}$ cm$^{-3}$.

The second capacitor insulating film 28 is formed of, for example, a metal oxide. The second capacitor insulating film 28 contains, for example, at least one metal element selected from the group consisting of zirconium (Zr), hafnium (Hf), aluminum (Al), yttrium (Y), lanthanum (La), and tantalum (Ta), and oxygen (O).

The second capacitor insulating film 28 contains, for example, zirconium oxide, hafnium oxide, hafnium silicate, aluminum oxide, yttrium oxide, lanthanum oxide, or tantalum oxide. The second capacitor insulating film 28 is formed of, for example, zirconium oxide, hafnium oxide, hafnium silicate, aluminum oxide, yttrium oxide, lanthanum oxide, or tantalum oxide. The second capacitor insulating film 28 is, for example, a stacked film formed by stacking zirconium oxide, aluminum oxide, and zirconium oxide in this order.

A thickness of the second capacitor insulating film 28 is, for example, equal to or more than 1 nm and equal to or less than 20 nm. The thickness of the second capacitor insulating film 28 in the second direction is, for example, equal to or more than 1 nm and equal to or less than 20 nm.

The insulating layer 29 is provided between the second storage node electrode 26 and the second plate electrode 27 in the first direction. The insulating layer 29 is in contact with the second storage node electrode 26 and the second plate electrode 27. The insulating layer 29 electrically separates the second storage node electrode 26 from the second plate electrode 27. A thickness of the insulating layer 29 in the first direction is, for example, greater than the thickness of the second capacitor insulating film 28 in the second direction.

A material of the insulating layer 29 is different from a material of the second capacitor insulating film 28. A chemical composition of the insulating layer 29 is different from a chemical composition of the second capacitor insulating film 28. The insulating layer 29 contains, for example, silicon oxide, silicon nitride, or silicon oxynitride. The insulating layer 29 is formed of, for example, silicon oxide, silicon nitride, or silicon oxynitride.

The interlayer insulating layer 34 has a function of electrically separating members constituting the memory cell array 110 from each other. The interlayer insulating layer 34 is, for example, a silicon oxide layer.

Next, an example of a manufacturing method of the memory cell array 110 according to the first embodiment will be described.

FIGS. 7, 8, 9, 10, 11, 12, 13, 14, 15, 16, 17, 18, 19, 20, 21, 22, and 23 are schematic cross-sectional views illustrating the manufacturing method of the memory cell array of the first embodiment. FIGS. 7 to 23 are cross sections corresponding to FIG. 4.

First, a first silicon oxide film 42, a first titanium nitride film 44, and a second silicon oxide film 46 are formed on the silicon substrate 30. The first silicon oxide film 42, the first titanium nitride film 44, and the second silicon oxide film 46 are formed by, for example, a chemical vapor deposition method (CVD method).

Figure 7:
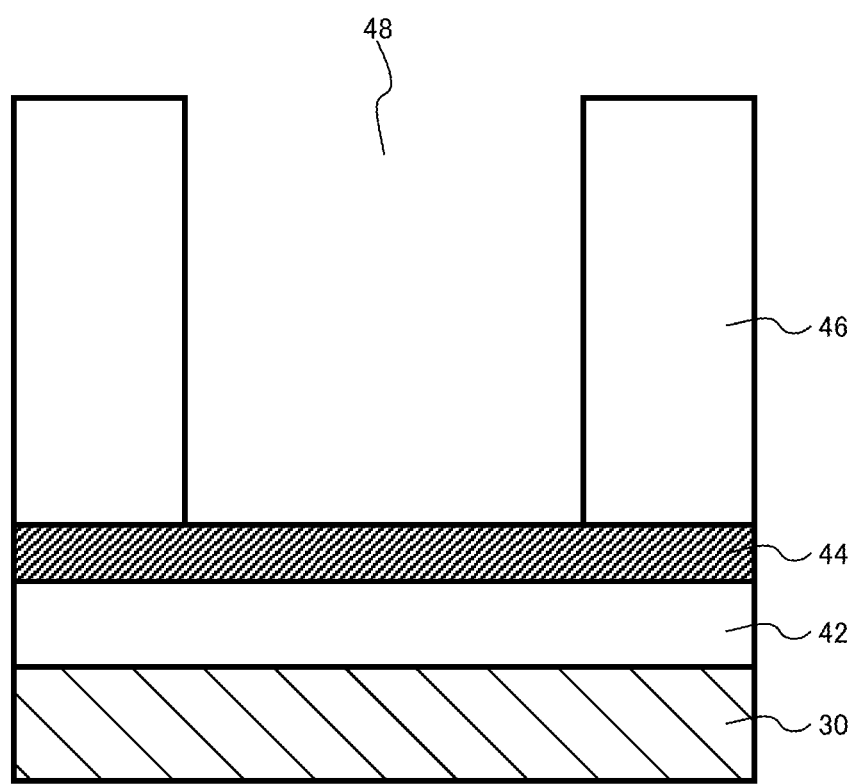
FIG. 7 is a schematic cross-sectional view illustrating a manufacturing method of a memory cell array according to the first embodiment.

Next, an opening 48 reaching the first titanium nitride film 44 is formed in the second silicon oxide film 46 (FIG. 7). The opening 48 is formed by using, for example, a lithography method and a reactive ion etching method (RIE method).

Figure 8:
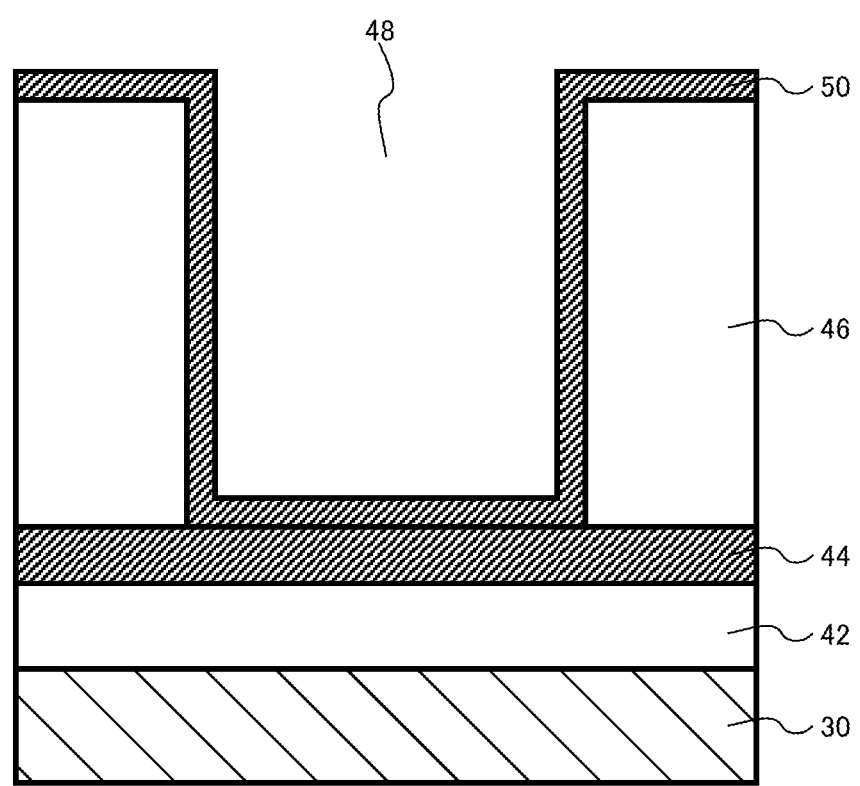
FIG. 8 is a schematic cross-sectional view illustrating a manufacturing method of the memory cell array according to the first embodiment.

Next, a second titanium nitride film 50 is formed in a region including the inside of the opening 48 (FIG. 8). The second titanium nitride film 50 is formed by, for example, the CVD method.

Figure 9:
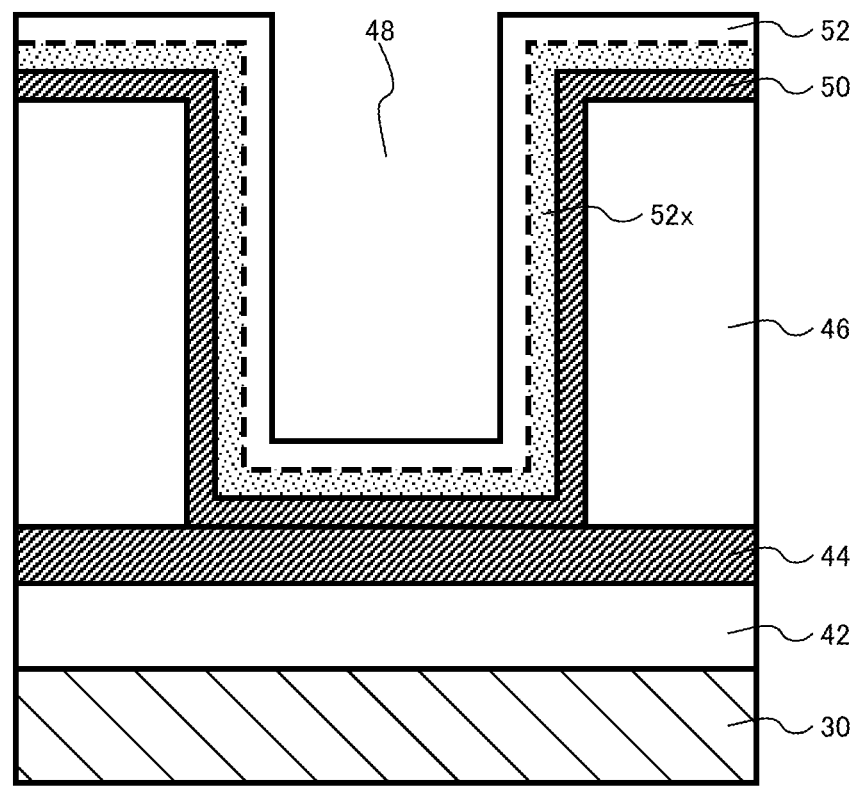
FIG. 9 is a schematic cross-sectional view illustrating a manufacturing method of the memory cell array according to the first embodiment.

Next, a first zirconium oxide film 52 is formed on the second titanium nitride film 50 (FIG. 9). The first zirconium oxide film 52 is formed by, for example, the CVD method. During the formation of the first zirconium oxide film 52, titanium (Ti) of the second titanium nitride film 50 is taken into the first zirconium oxide film 52, and a first high-concentration region 52$x$ having a high titanium concentration is formed.

Figure 10:
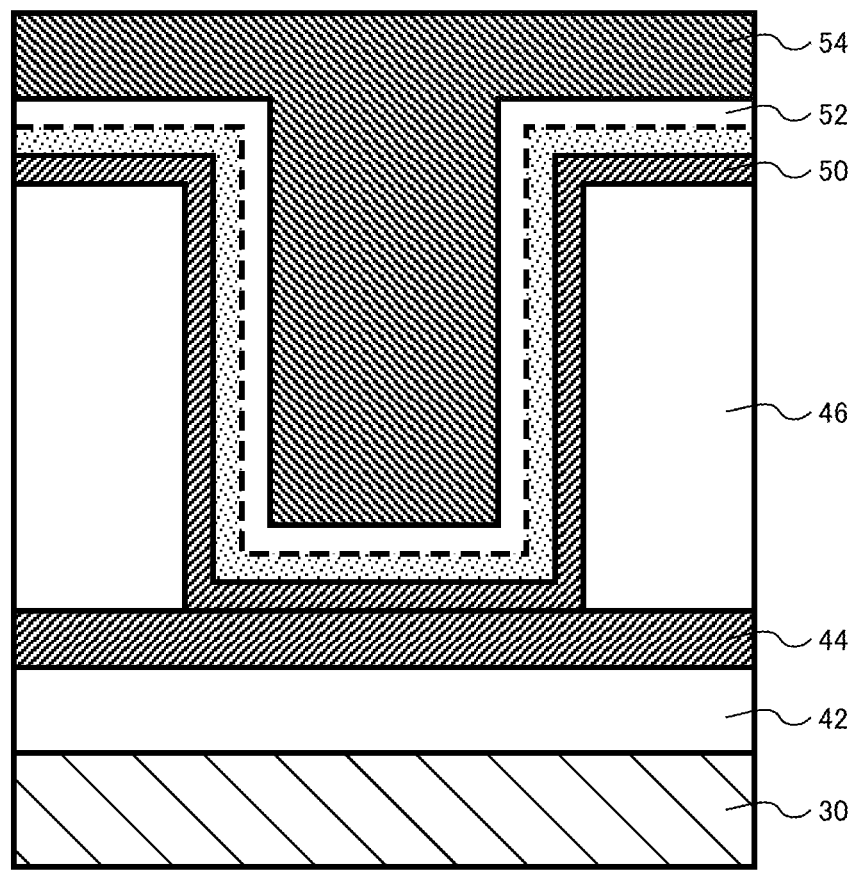
FIG. 10 is a schematic cross-sectional view illustrating a manufacturing method of the memory cell array according to the first embodiment.

Next, a third titanium nitride film 54 is formed on the first zirconium oxide film 52 (FIG. 10). The opening 48 is filled with the third titanium nitride film 54. The third titanium nitride film 54 is formed by, for example, the CVD method.

Figure 11:
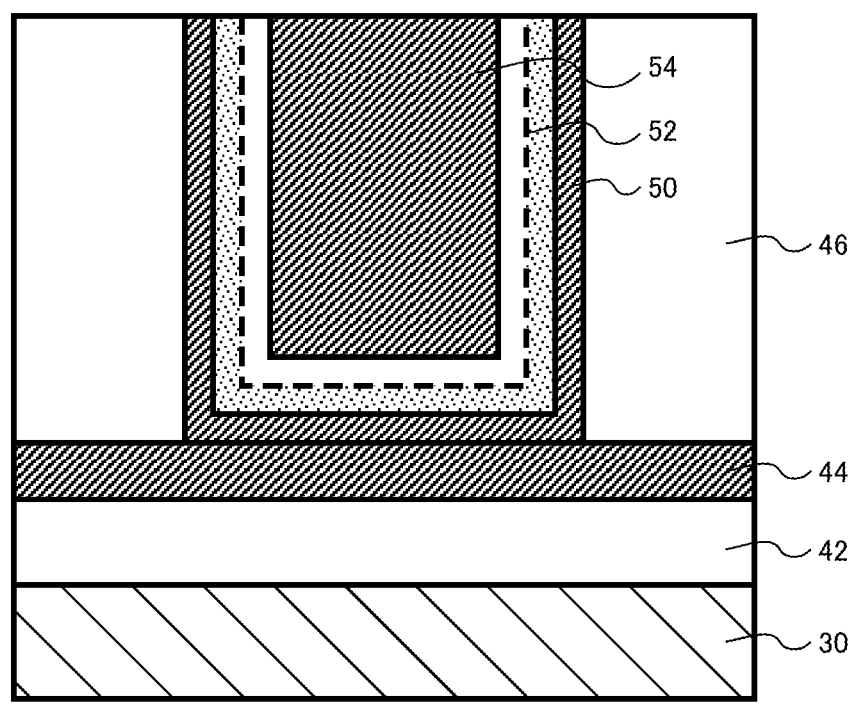
FIG. 11 is a schematic cross-sectional view illustrating a manufacturing method of the memory cell array according to the first embodiment.

Next, the third titanium nitride film 54, the first zirconium oxide film 52, and the second titanium nitride film 50 on the second silicon oxide film 46 are removed (FIG. 11). The third titanium nitride film 54, the first zirconium oxide film 52, and the second titanium nitride film 50 are removed by, for example, the RIE method or a chemical mechanical polishing method (CMP method).

Figure 12:
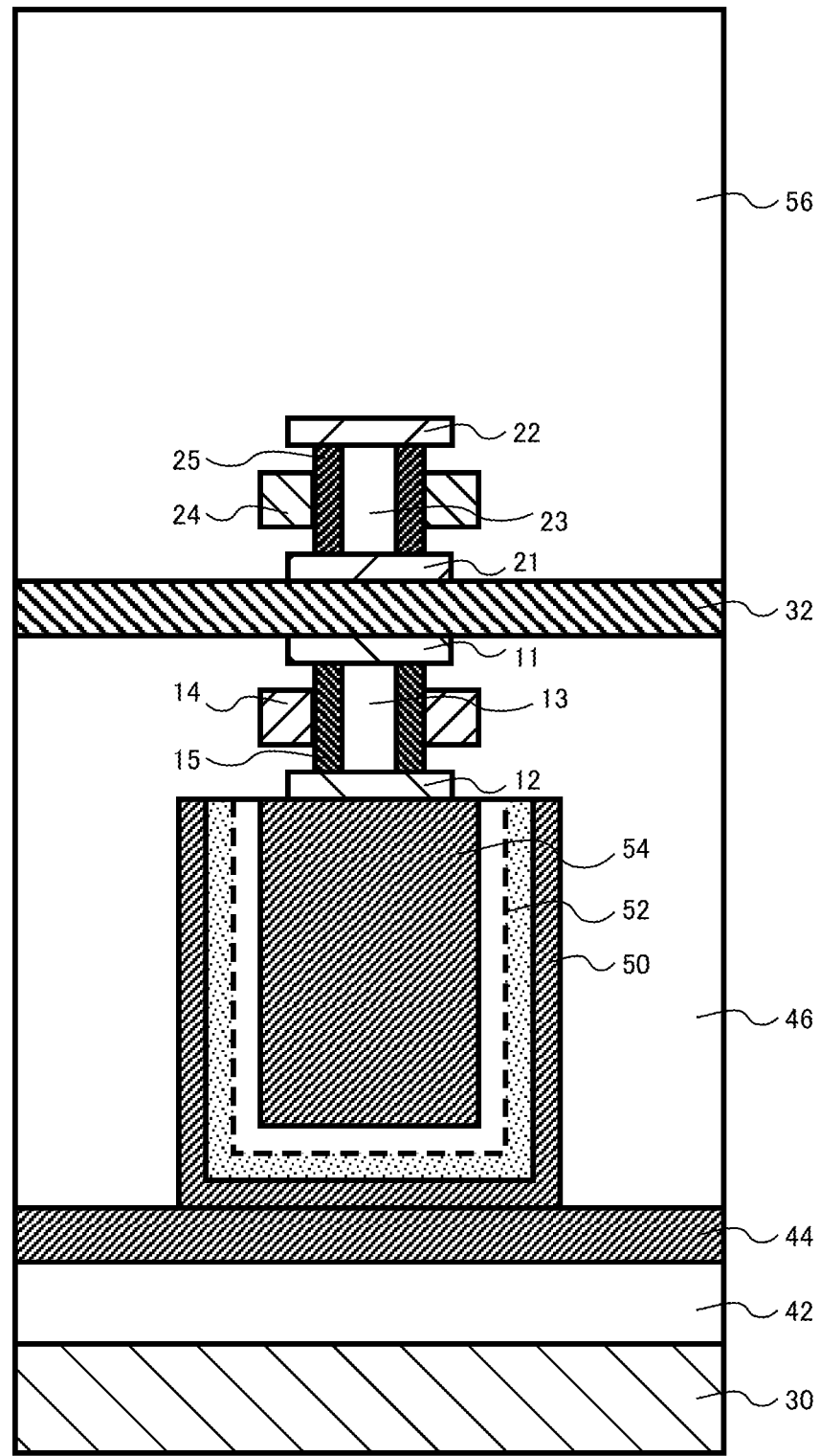
FIG. 12 is a schematic cross-sectional view illustrating a manufacturing method of the memory cell array according to the first embodiment.

Next, the first source electrode 11, the first drain electrode 12, the first oxide semiconductor layer 13, the first gate electrode 14, the first gate insulating film 15, the second source electrode 21, the second drain electrode 22, the second oxide semiconductor layer 23, the second gate electrode 24, the second gate insulating film 25, the wiring layer 32, and a third silicon oxide film 56 are formed by using a known process technique (FIG. 12).

Figure 13:
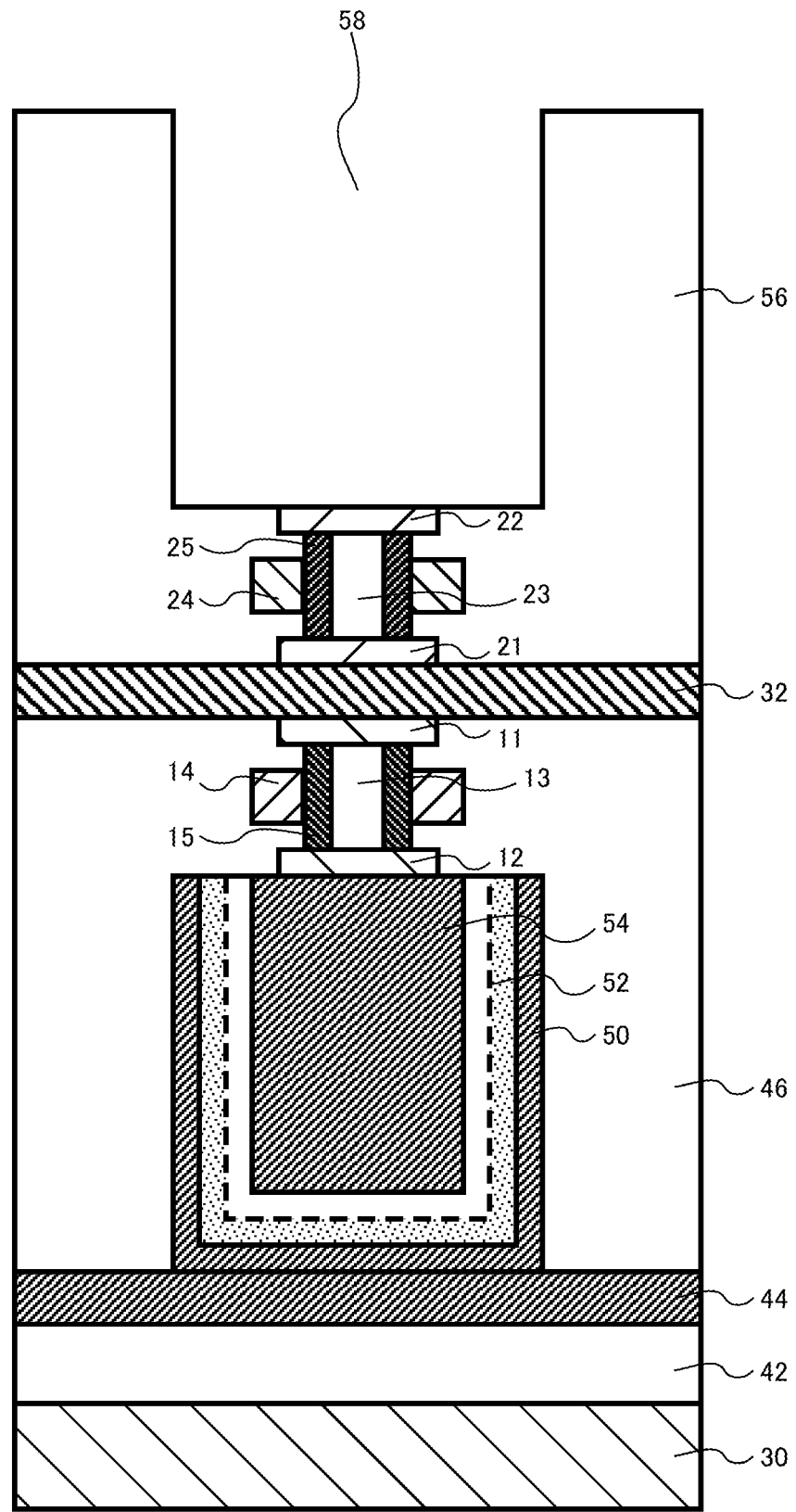
FIG. 13 is a schematic cross-sectional view illustrating a manufacturing method of the memory cell array according to the first embodiment.

Next, an opening 58 reaching the second drain electrode 22 is formed in the third silicon oxide film 56 (FIG. 13). The opening 58 is formed by, for example, the lithography method and the RIE method.

Figure 14:
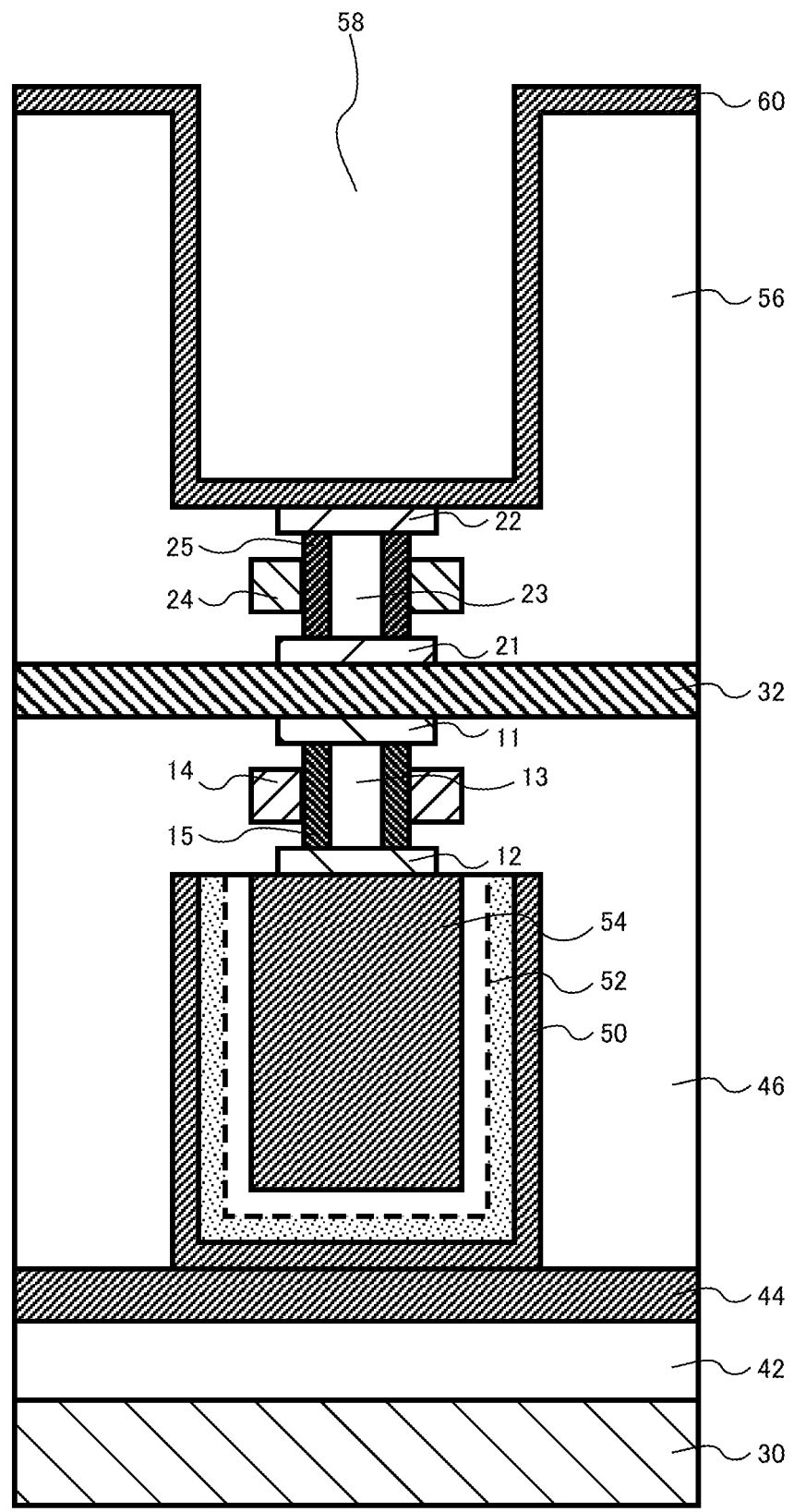
FIG. 14 is a schematic cross-sectional view illustrating a manufacturing method of the memory cell array according to the first embodiment.

Next, a fourth titanium nitride film 60 is formed in a region including the inside of the opening 58 (FIG. 14). The fourth titanium nitride film 60 is formed by, for example, the CVD method.

Figure 15:
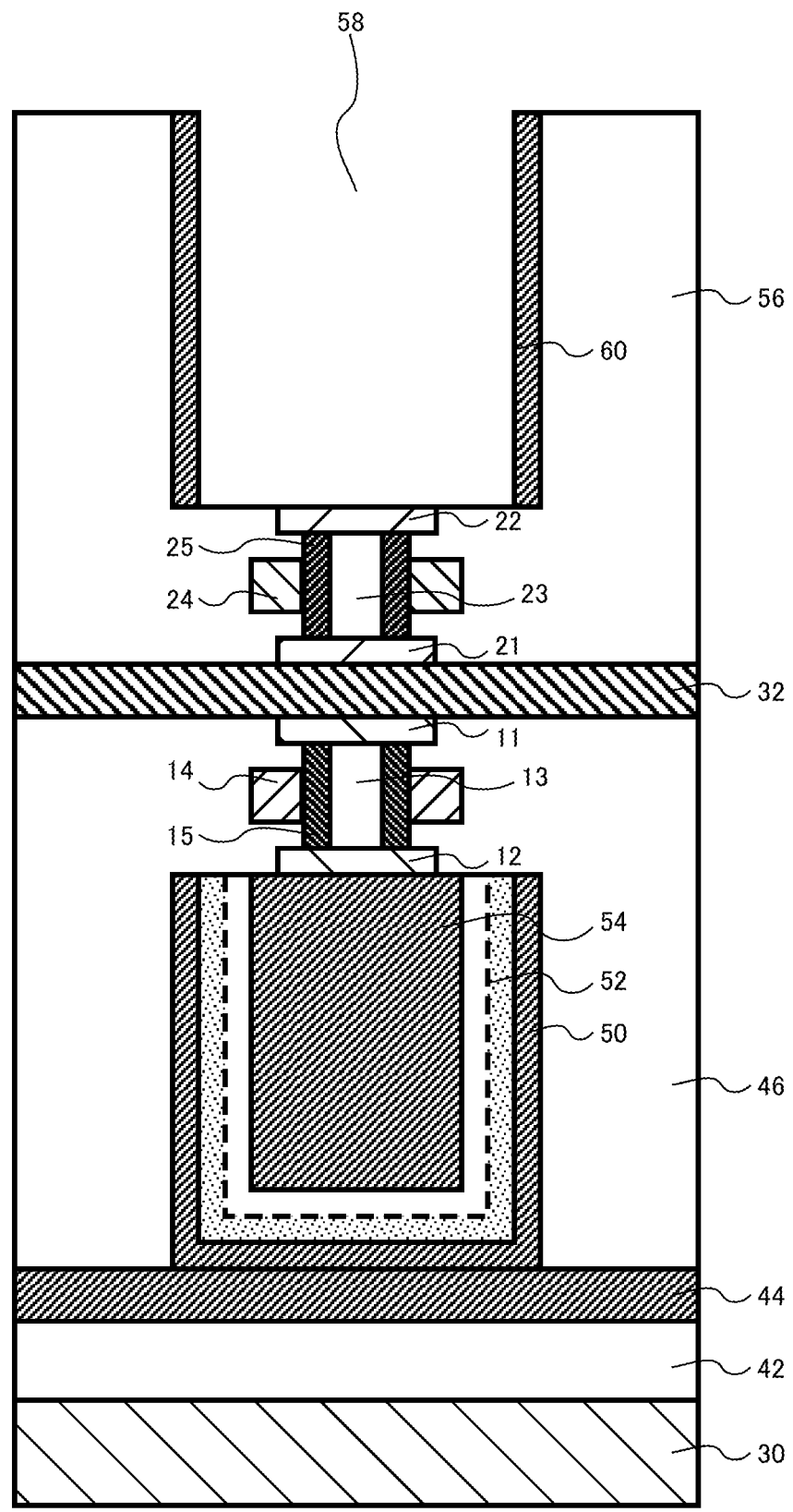
FIG. 15 is a schematic cross-sectional view illustrating a manufacturing method of the memory cell array according to the first embodiment.

Next, the fourth titanium nitride film 60 on the third silicon oxide film 56 and on the bottom of the opening 58 is removed (FIG. 15). The fourth titanium nitride film 60 is removed by, for example, the RIE method.

Figure 16:
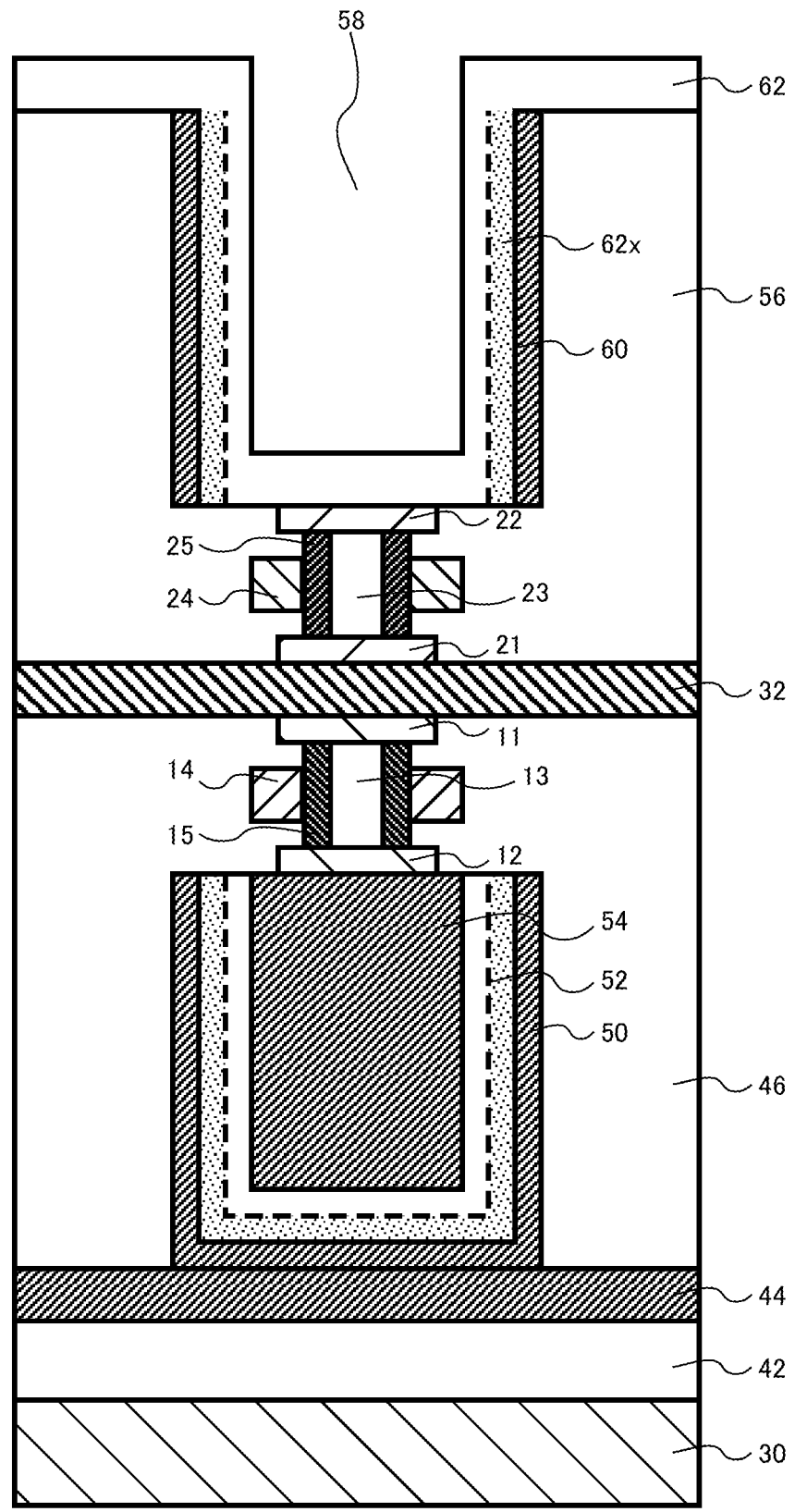
FIG. 16 is a schematic cross-sectional view illustrating a manufacturing method of the memory cell array according to the first embodiment.

Next, a second zirconium oxide film 62 is formed on the fourth titanium nitride film 60 (FIG. 16). The second zirconium oxide film 62 is formed by, for example, the CVD method. During the formation of the second zirconium oxide film 62, titanium (Ti) of the fourth titanium nitride film 60 is taken into the second zirconium oxide film 62, and a second high-concentration region 62$x$ having a high titanium concentration is formed.

Figure 17:
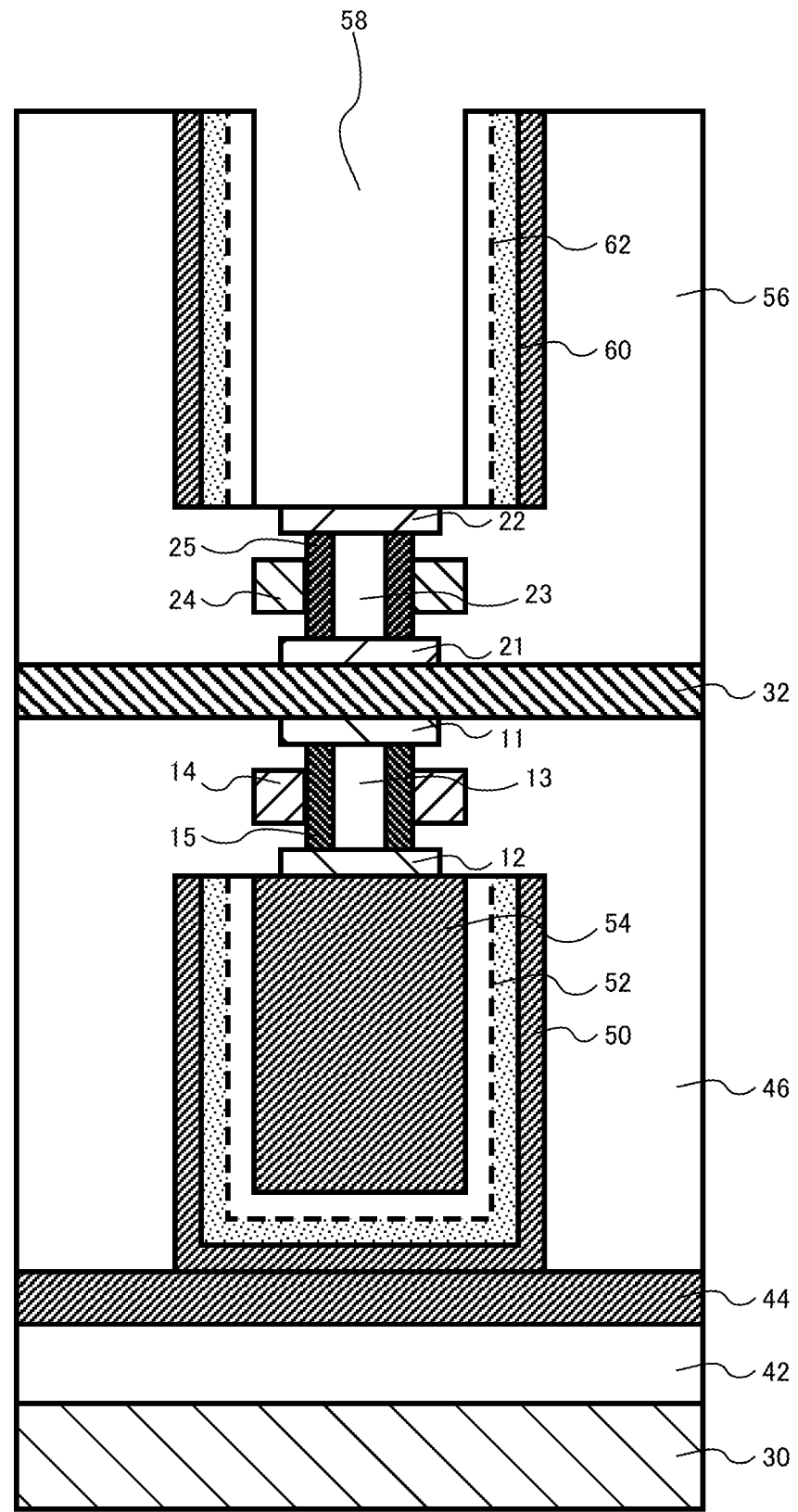
FIG. 17 is a schematic cross-sectional view illustrating a manufacturing method of the memory cell array according to the first embodiment.

Next, the second zirconium oxide film 62 on the third silicon oxide film 56 and on the bottom of the opening 58 is removed (FIG. 17). The second zirconium oxide film 62 is removed by, for example, the RIE method.

Figure 18:
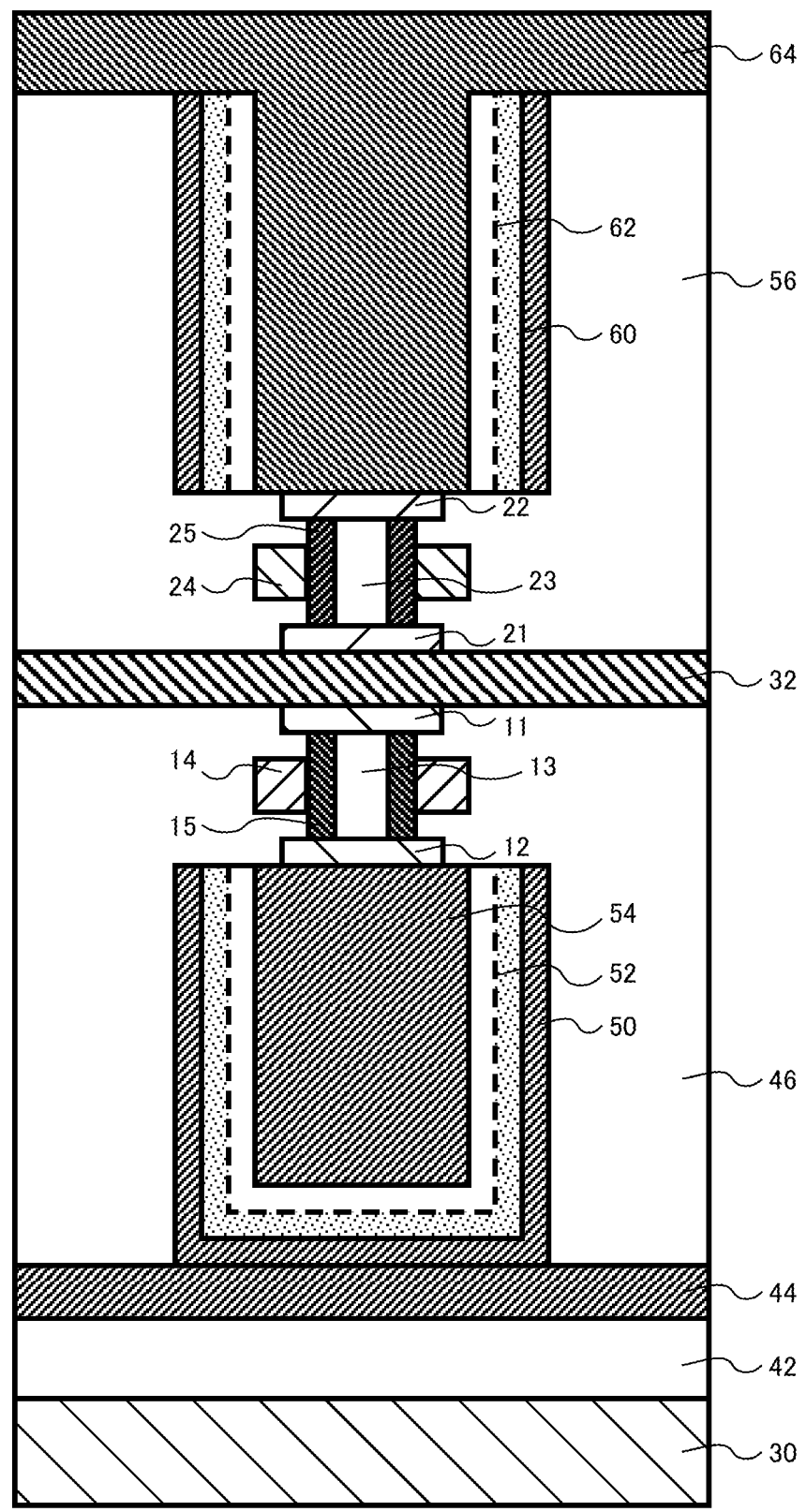
FIG. 18 is a schematic cross-sectional view illustrating a manufacturing method of the memory cell array according to the first embodiment.

Next, a fifth titanium nitride film 64 is formed on the second zirconium oxide film 62 (FIG. 18). The opening 58 is filled with the fifth titanium nitride film 64. The fifth titanium nitride film 64 is formed by, for example, the CVD method.

Figure 19:
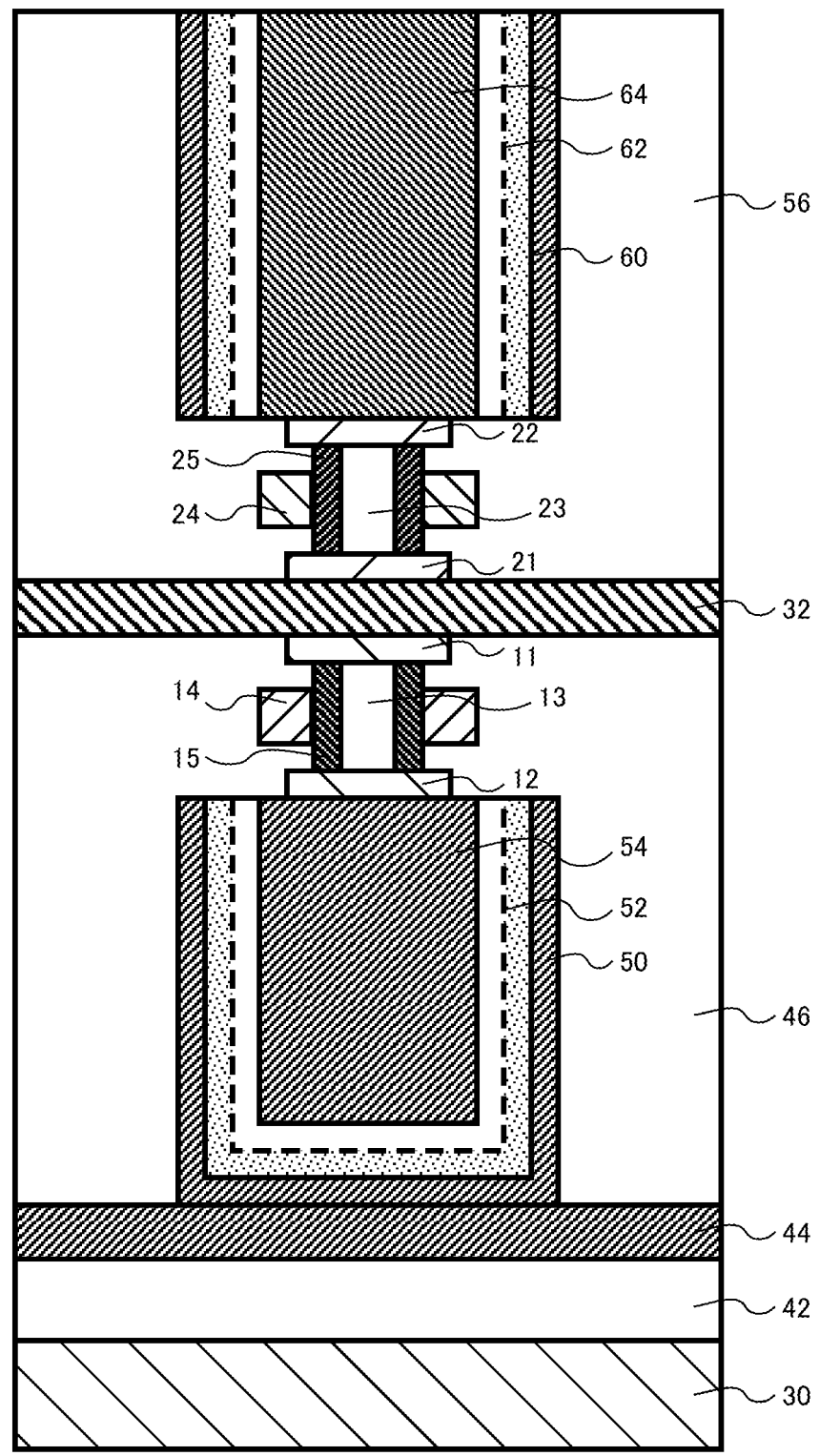
FIG. 19 is a schematic cross-sectional view illustrating a manufacturing method of the memory cell array according to the first embodiment.

Next, the fifth titanium nitride film 64 on the third silicon oxide film 56 is removed (FIG. 19). The fifth titanium nitride film 64 is removed by, for example, the CMP method.

Figure 20:
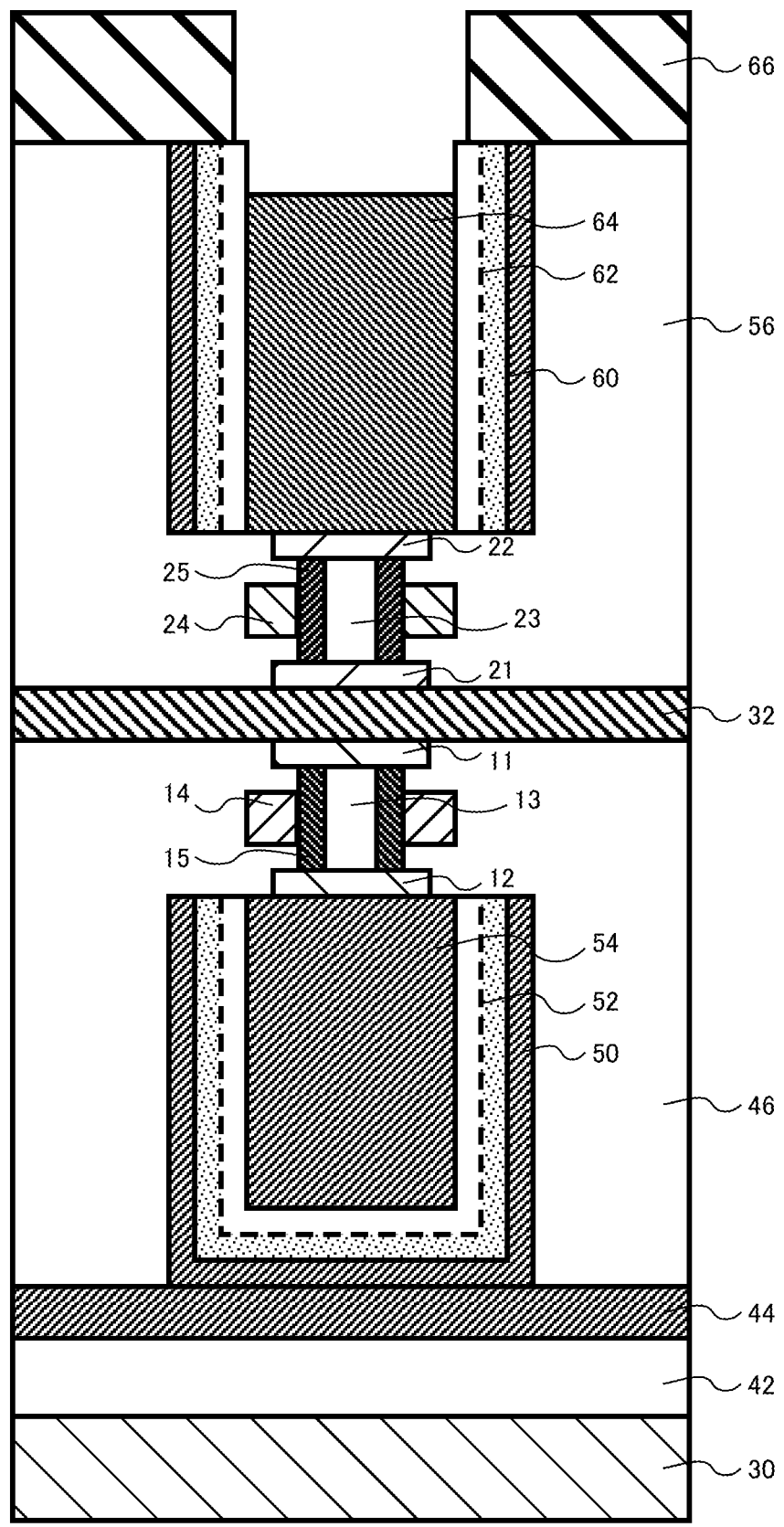
FIG. 20 is a schematic cross-sectional view illustrating a manufacturing method of the memory cell array according to the first embodiment.

Next, a part of the fifth titanium nitride film 64 is removed (FIG. 20). The fifth titanium nitride film 64 is removed by the RIE method by using, for example, a photoresist mask 66 formed by the lithography method as a mask material.

Figure 21:
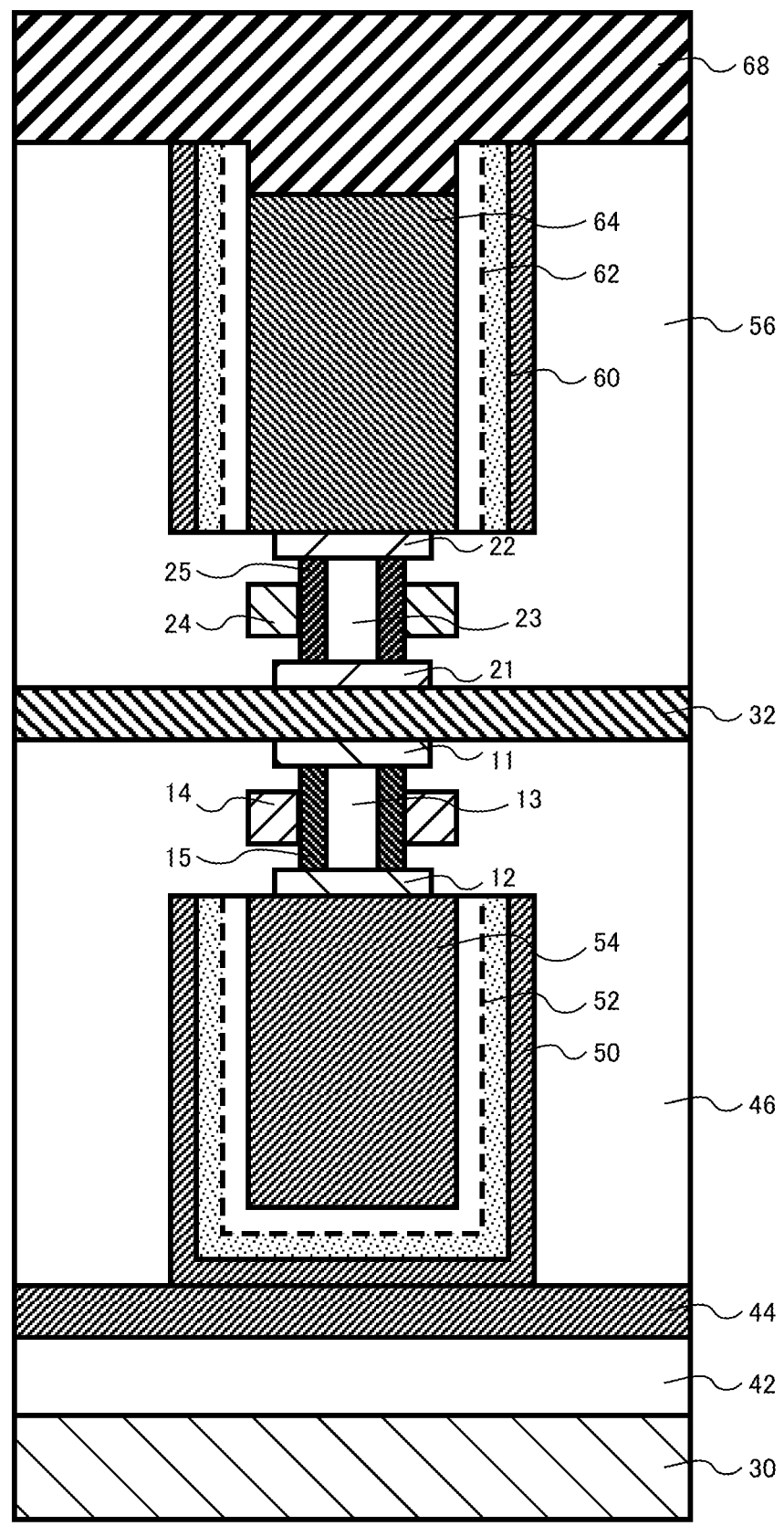
FIG. 21 is a schematic cross-sectional view illustrating a manufacturing method of the memory cell array according to the first embodiment.

Next, a fourth silicon oxide film 68 is formed on the fifth titanium nitride film 64 (FIG. 21). The fourth silicon oxide film 68 is formed by, for example, the CVD method.

Figure 22:
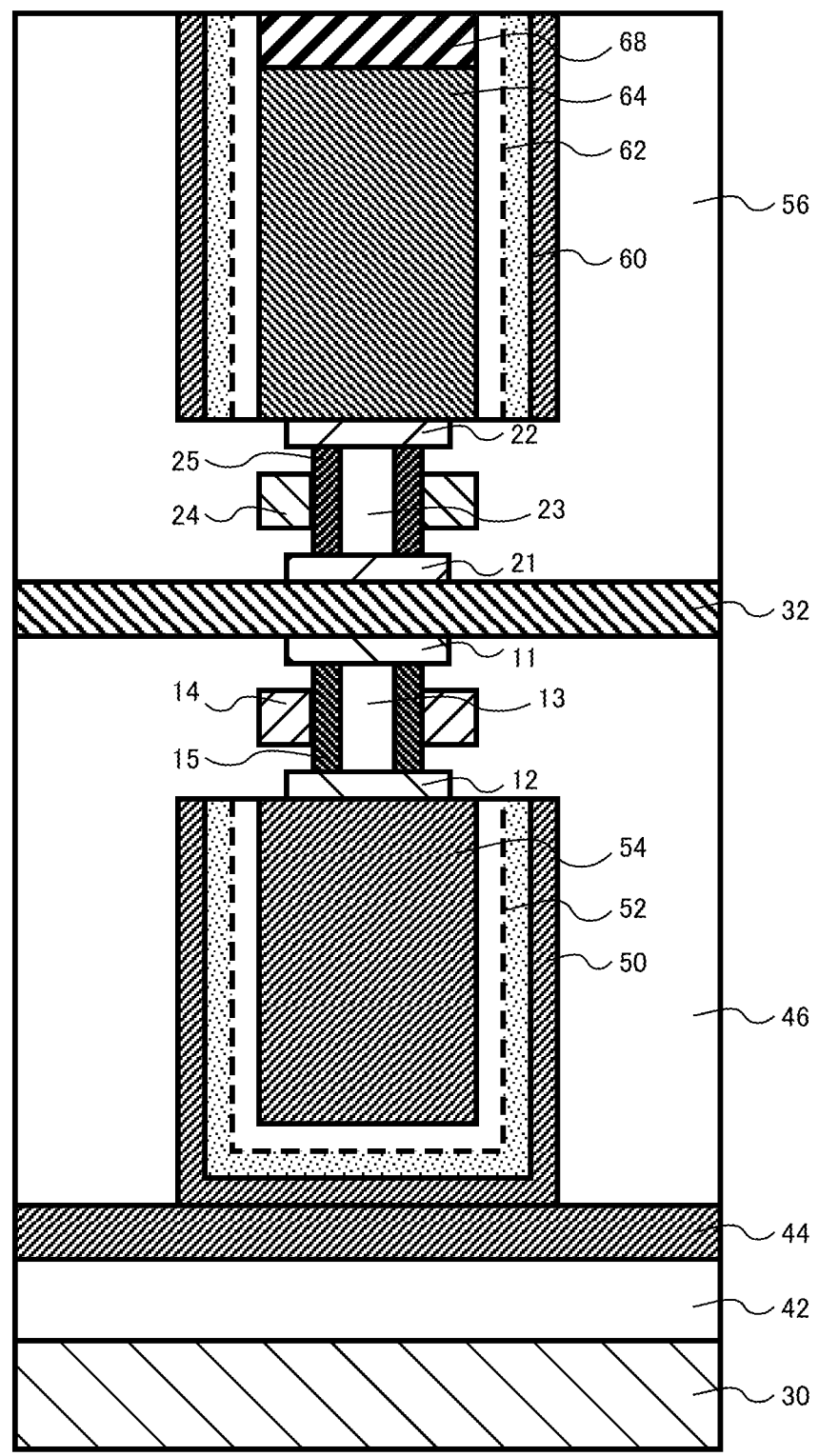
FIG. 22 is a schematic cross-sectional view illustrating a manufacturing method of the memory cell array according to the first embodiment.

Next, a part of the fourth silicon oxide film 68 is removed (FIG. 22). The fourth silicon oxide film 68 is removed by, for example, the RIE method.

Figure 23:
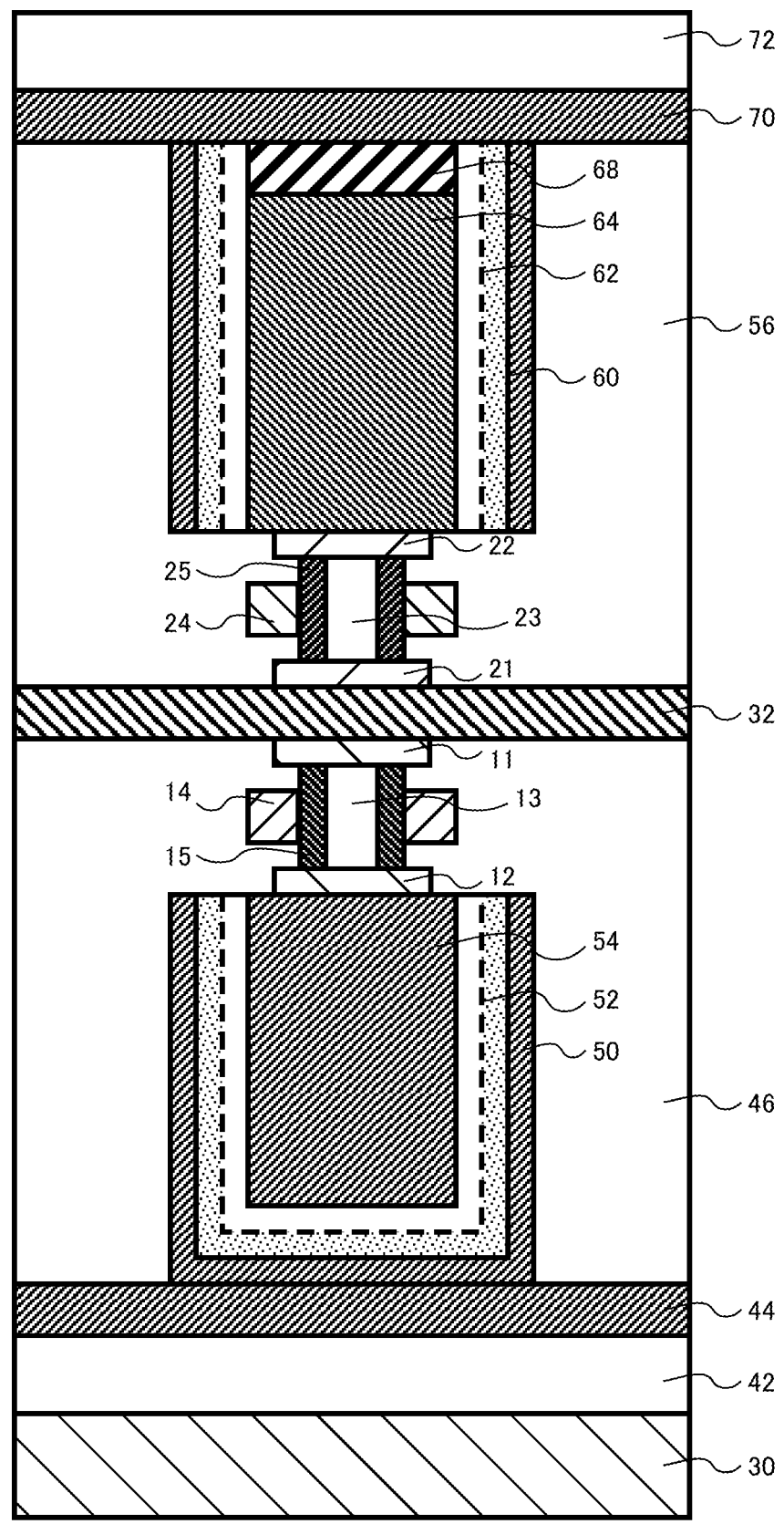
FIG. 23 is a schematic cross-sectional view illustrating a manufacturing method of the memory cell array according to the first embodiment.

Next, a sixth titanium nitride film 70 and a fifth silicon oxide film 72 are formed on the fourth silicon oxide film 68 and the third silicon oxide film 56 (FIG. 23). The sixth titanium nitride film 70 and the fifth silicon oxide film 72 are formed by, for example, the CVD method.

The memory cell array 110 illustrated in FIG. 4 is formed by the manufacturing method described above.

Hereinafter, a function and an effect of the semiconductor memory device according to the first embodiment will be described.

An oxide semiconductor transistor, in which a channel is formed in an oxide semiconductor layer, has an excellent characteristic that a channel leakage current during an off operation, that is, an off-leak current is extremely small. Since the oxide semiconductor transistor is applied to a switching transistor of the DRAM, a leakage of the electric charge from the memory cell is reduced, and improvement of charge storage characteristic of a memory cell is expected. By improving the charge storage characteristic of the memory cell, for example, a refresh time of the DRAM can be increased, and power consumption of the DRAM can be reduced.

When the off-leak current of the switching transistor is reduced, the leakage current of the capacitor insulating film may become a main cause of the leakage of the electric charge from the memory cell instead of the off-leak current of the switching transistor. Therefore, it is desirable to reduce the leakage current of the capacitor insulating film.

FIG. 24 is an enlarged schematic cross-sectional view of a memory cell array of the semiconductor memory device according to a comparative example. FIG. 24 is a view corresponding to FIG. 4 of the first embodiment.

A memory cell array 910 of the comparative example includes the first memory cell MC1 and the second memory cell MC2.

The memory cell array 910 of the comparative example is different from the memory cell array 110 of the first embodiment in that the first storage node electrode 16 of the first memory cell MC1 surrounds the first plate electrode 17. In other words, the memory cell array 910 of the comparative example is different from the memory cell array 110 of the first embodiment in that the first plate electrode 17 is provided inside the first storage node electrode 16.

The first capacitor insulating film 18 of the memory cell array 910 of the comparative example includes a first low-concentration region 18x and a first high-concentration region 18y. The first high-concentration region 18y is provided between the first low-concentration region 18x and the first plate electrode 17.

The memory cell array 910 of the comparative example is different from the memory cell array 110 of the first embodiment in that the second storage node electrode 26 of the second memory cell MC2 surrounds the second plate electrode 27. In other words, the memory cell array 910 of the comparative example is different from the memory cell array 110 of the first embodiment in that the second plate electrode 27 is provided inside the second storage node electrode 26.

The second capacitor insulating film 28 of the memory cell array 910 of the comparative example includes a second low-concentration region 28x and a second high-concentration region 28y. The second high-concentration region 28y is provided between the second low-concentration region 28x and the second storage node electrode 26. The second memory cell MC2 of the comparative example is different from the second memory cell MC2 of the first embodiment in that a region having a high atomic concentration of titanium (Ti) of the second capacitor insulating film 28 is not provided on the second plate electrode 27 side but provided on the second storage node electrode 26 side.

Figure 25A:
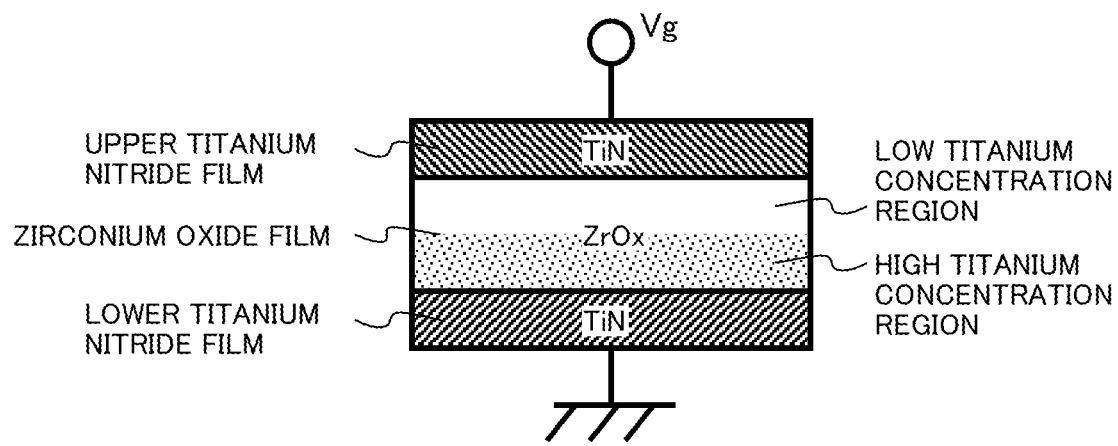
FIGS. 25A and 25B are explanatory diagrams of a function and an effect of the semiconductor memory device according to the first embodiment.
Figure 25B:
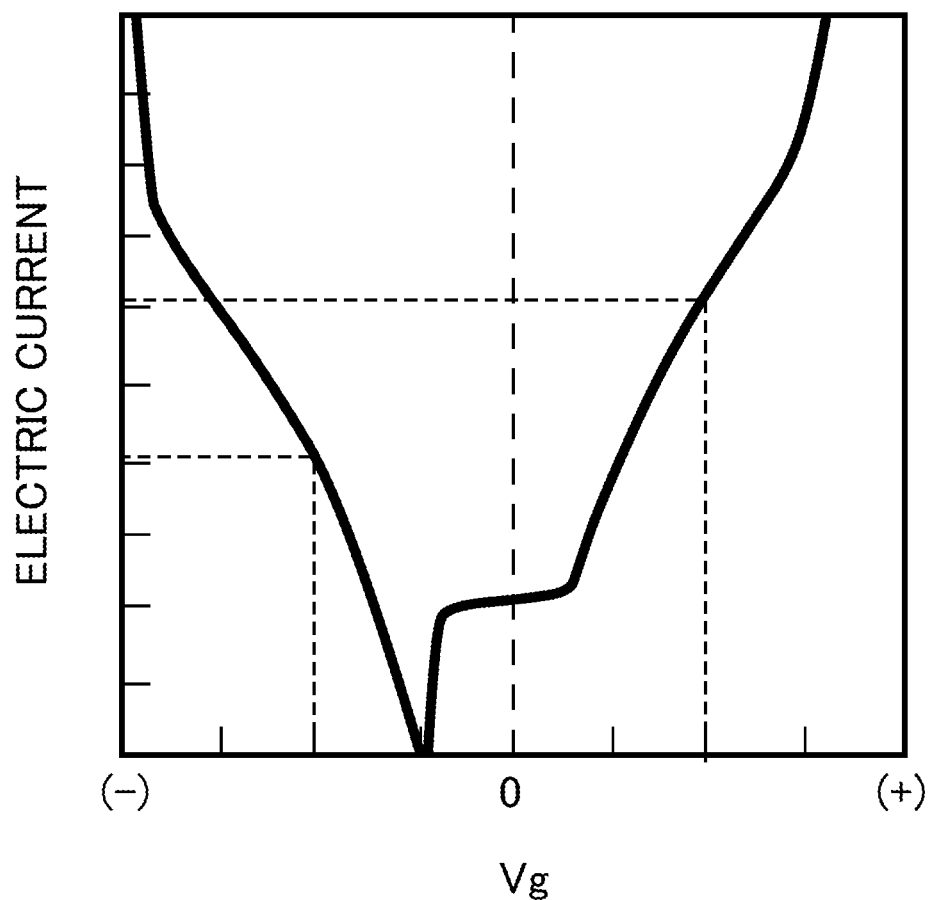

FIGS. 25A and 25B are an explanatory diagram of a function and an effect of the semiconductor memory device according to the first embodiment. FIGS. 25A and 25B are diagrams illustrating evaluation results of a leakage current of the capacitor insulating film. FIG. 25A is a diagram illustrating a structure of an evaluation sample. FIG. 25B is a diagram illustrating a voltage-current characteristic of the evaluation sample of FIG. 25A.

As illustrated in FIG. 25A, the evaluation sample was prepared by forming a zirconium oxide film on a lower titanium nitride film and forming an upper titanium nitride film on the zirconium oxide film. When the zirconium oxide film is formed on the lower titanium nitride film, titanium of the lower titanium nitride film is taken into the zirconium oxide film. Therefore, a high titanium concentration region having a high atomic concentration of titanium is formed on the lower titanium nitride film side of the zirconium oxide film.

As illustrated in FIG. 25A, the upper titanium nitride film and the lower titanium nitride film are used as electrodes, a gate voltage Vg is applied to the upper titanium nitride film side, and a leakage current of the zirconium oxide film is measured. FIG. 25B illustrates an evaluation result.

As illustrated in FIG. 25B, the voltage-current characteristic of the zirconium oxide film is dependent on a direction in which the gate voltage Vg is applied. The leakage current in a case where the gate voltage Vg is a positive voltage is greater than the leakage current in a case where the gate voltage Vg is a negative voltage.

It is considered that the magnitude of the leakage current is dependent on the direction in which the gate voltage Vg is applied due to the presence of the high titanium concentration region. In a case where a positive voltage is applied to the electrode on the high titanium concentration region side, the leakage current decreases as compared with the case where the positive voltage is applied to the electrode on the low titanium concentration region side.

A case where a positive voltage is applied to the first plate electrode 17 and the second plate electrode 27 to operate the memory cell in the memory cell array 910 of the comparative example is considered. In the first memory cell MC1, the first high-concentration region 18y having a high atomic concentration of titanium is provided on the first plate electrode 17 side of the first capacitor insulating film 18. Therefore, in the first memory cell MC1, the leakage current of the first capacitor insulating film 18 can be suppressed in a case where the positive voltage is applied to the first plate electrode 17. Accordingly, the charge storage characteristic of the first memory cell MC1 is improved.

On the other hand, in the second memory cell MC2 of the memory cell array 910 of the comparative example, the second high-concentration region 28y having a high atomic concentration of titanium is provided on the second storage node electrode 26 side of the second capacitor insulating film 28. Therefore, in the second memory cell MC2, the leakage current of the second capacitor insulating film 28 increases as compared with that of the first memory cell MC1 in a case where the positive voltage is applied to the second plate electrode 27. Accordingly, the charge storage characteristic of the second memory cell MC2 may be degraded.

In the second memory cell MC2 of the memory cell array 910 of the comparative example, due to a structure of the capacitor, the second capacitor insulating film 28 is formed on the second storage node electrode 26 to manufacture the capacitor. Therefore, the second high-concentration region 28y having a high atomic concentration of titanium is inevitably formed on the second storage node electrode 26 side of the second capacitor insulating film 28.

A case where the positive voltage is applied to the first plate electrode 17 and the second plate electrode 27 to operate the memory cell in the memory cell array 110 of the first embodiment is considered. In the first memory cell MC1, the first high-concentration region 18b having a high atomic concentration of titanium is provided on the first plate electrode 17 side of the first capacitor insulating film 18. Therefore, in the first memory cell MC1, the leakage current of the first capacitor insulating film 18 can be suppressed in a case where the positive voltage is applied to the first plate electrode 17. Accordingly, the charge storage characteristic of the first memory cell MC1 is improved.

In the second memory cell MC2 of the memory cell array 110 of the first embodiment, the second high-concentration region 28b having a high atomic concentration of titanium is provided on the second plate electrode 27 side of the second capacitor insulating film 28. Therefore, in the second memory cell MC2, the leakage current of the second capacitor insulating film 28 can be suppressed in a case where the positive voltage is applied to the second plate electrode 27. Accordingly, the charge storage characteristic of the second memory cell MC2 is also improved similarly to the first memory cell MC1.

In both of the first memory cell MC1 and the second memory cell MC2 of the memory cell array 110 of the first embodiment, a region having a high atomic concentration of titanium is provided on a plate electrode side of the capacitor insulating film. Therefore, in a case where the positive voltage is applied to the plate electrode to operate the memory cell, the charge storage characteristic of both the first memory cell MC1 and the second memory cell MC2 are improved.

In a case where a metal oxide is used for the capacitor insulating film, when titanium (Ti) is contained as an additive element, an equivalent oxide thickness (EOT) of the capacitor insulating film is reduced. Therefore, in the memory cell array 110 of the first embodiment, capacitance of the capacitor increases, and an electric charge storage amount of the memory cell increases. Therefore, the charge storage characteristic is improved.

From the viewpoint of reducing the equivalent oxide thickness of the first capacitor insulating film 18, the atomic concentration of titanium (Ti) of the first high-concentration region 18b is preferably equal to or more than $1 \times 10^{17}$ cm$^{-3}$, and more preferably equal to or more than $5 \times 10^{17}$ cm$^{-3}$. From the viewpoint of reducing the equivalent oxide thickness of the second capacitor insulating film 28, an atomic concentration of titanium (Ti) of the second high-concentration region 28b is preferably equal to or more than $1 \times 10^{17}$ cm$^{-3}$, and more preferably equal to or more than $5 \times 10^{17}$ cm$^{-3}$.

From the viewpoint of reducing the equivalent oxide thickness of the first capacitor insulating film 18, the atomic concentration of titanium (Ti) of the first high-concentration region 18b is preferably equal to or more than ten times the atomic concentration of titanium (Ti) of the first low-concentration region 18a, and more preferably equal to or more than one million times the atomic concentration of titanium (Ti) of the first low-concentration region 18a. From the viewpoint of reducing the equivalent oxide thickness of the second capacitor insulating film 28, the atomic concentration of titanium (Ti) of the second high-concentration region 28b is preferably equal to or more than ten times the atomic concentration of titanium (Ti) of the second low-concentration region 28a, and more preferably equal to or more than one million times the atomic concentration of titanium (Ti) of the second low-concentration region 28a.

From the viewpoint of suppressing the leakage current of the first capacitor insulating film 18, the atomic concentration of titanium (Ti) of the first high-concentration region 18b of the first capacitor insulating film 18 is preferably equal to or less than $1 \times 10^{20}$ cm$^{-3}$, and more preferably equal to or less than $1 \times 10^{19}$ cm$^{-3}$. From the viewpoint of suppressing the leakage current of the second capacitor insulating film 28, the atomic concentration of titanium (Ti) of the second high-concentration region 28b of the second capacitor insulating film 28 is preferably equal to or less than $1 \times 10^{20}$ cm$^{-3}$, and more preferably equal to or less than $1 \times 10^{19}$ cm$^{-3}$.

As described above, according to the first embodiment, the semiconductor memory device including the capacitor insulating film having a small leakage current can be realized.

Second Embodiment

A semiconductor memory device of the second embodiment is different from the semiconductor memory device of the first embodiment in that the semiconductor memory device of the second embodiment does not include the first source electrode 11, the first drain electrode 12, the second source electrode 21, and the second drain electrode 22. Hereinafter, descriptions overlapping with those in the first embodiment may be partially omitted.

Figure 26:
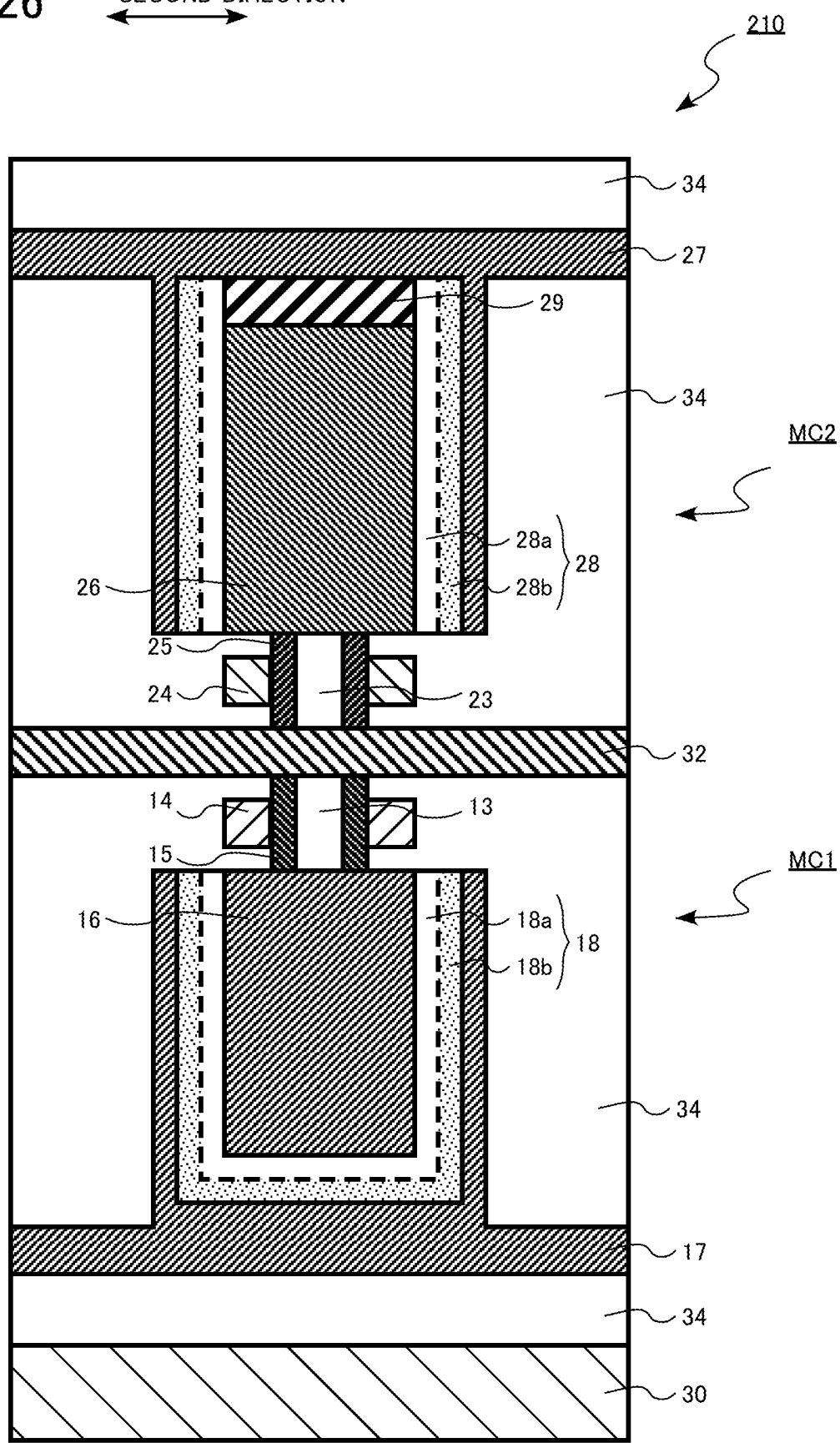
FIG. 26 is an enlarged schematic cross-sectional view of a memory cell array of a semiconductor memory device according to a second embodiment.

FIG. 26 is an enlarged schematic cross-sectional view of a memory cell array of the semiconductor memory device according to the second embodiment. FIG. 26 is a view corresponding to FIG. 4 of the first embodiment.

A memory cell array 210 of the second embodiment includes a first memory cell MC1 and a second memory cell MC2.

The first memory cell MC1 includes a first oxide semiconductor layer 13, a first gate electrode 14, a first gate insulating film 15, a first storage node electrode 16, a first plate electrode 17, and a first capacitor insulating film 18. The first capacitor insulating film 18 includes a first low-concentration region 18a and a first high-concentration region 18b.

The first storage node electrode 16 is an example of a first electrode. The first plate electrode 17 is an example of a second electrode. The first low-concentration region 18a is an example of a first region. The first high-concentration region 18b is an example of a second region.

The second memory cell MC2 includes a second oxide semiconductor layer 23, a second gate electrode 24, a second gate insulating film 25, a second storage node electrode 26, a second plate electrode 27, a second capacitor insulating film 28, and an insulating layer 29. The second capacitor insulating film 28 includes a second low-concentration region 28a and a second high-concentration region 28b.

The second storage node electrode 26 is an example of a third electrode. The second plate electrode 27 is an example of a fourth electrode. The second low-concentration region 28a is an example of a third region. The second high-concentration region 28b is an example of a fourth region.

The memory cell array 110 includes a silicon substrate 30, a wiring layer 32, and an interlayer insulating layer 34. The silicon substrate 30 is an example of a substrate.

A part of the wiring layer 32 is an example of a first conductive layer. A part of the first storage node electrode 16 is an example of a second conductive layer.

A part of the wiring layer 32 is an example of a third conductive layer. A part of the second storage node electrode 26 is an example of a fourth conductive layer.

As described above, according to the second embodiment, the semiconductor memory device including the capacitor insulating film having a small leakage current can be realized similarly to the first embodiment.

In the first and second embodiments, the structure in which the gate electrode surrounds the oxide semiconductor layer has been described as an example, but a structure in which the gate electrode does not surround the oxide semiconductor layer can be made.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first conductive layer;

a second conductive layer;

a first oxide semiconductor layer provided between the first conductive layer and the second conductive layer;

a first gate electrode surrounding the first oxide semiconductor layer;

a first gate insulating film provided between the first oxide semiconductor layer and the first gate electrode;

a first electrode provided in a first direction with respect to the second conductive layer, the first direction being a direction connecting the first conductive layer and the second conductive layer, the second conductive layer provided between the first oxide semiconductor layer and the first electrode, the first electrode electrically connected to the second conductive layer, and the first electrode containing titanium (Ti);

a second electrode surrounding the first electrode and containing the titanium (Ti);

a first capacitor insulating film provided between the first electrode and the second electrode, the first capacitor insulating film including a first region and a second region between the first region and the second electrode, an atomic concentration of the titanium (Ti) of the second region being higher than an atomic concentration of the titanium (Ti) of the first region;

a third conductive layer provided in the first direction with respect to the first conductive layer, the third conductive layer electrically connected to the first conductive layer;

a fourth conductive layer provided in the first direction with respect to the third conductive layer, the third conductive layer provided between the first conductive layer and the fourth conductive layer;

a second oxide semiconductor layer provided between the third conductive layer and the fourth conductive layer;

a second gate electrode surrounding the second oxide semiconductor layer;

a second gate insulating film provided between the second oxide semiconductor layer and the second gate electrode;

a third electrode provided in the first direction with respect to the fourth conductive layer, the fourth conductive layer provided between the second oxide semiconductor layer and the third electrode, the third electrode electrically connected to the fourth conductive layer, and the third electrode containing the titanium (Ti);

a fourth electrode surrounding the third electrode and containing the titanium (Ti); and a second capacitor insulating film provided between the third electrode and the fourth electrode, the second capacitor insulating film including a third region and a fourth region between the third region and the fourth electrode, an atomic concentration of the titanium (Ti) of the fourth region being higher than an atomic concentration of the titanium (Ti) of the third region.

2. The semiconductor memory device according to claim 1, wherein the atomic concentration of the titanium (Ti) of the second region is equal to or more than ten times the atomic concentration of the titanium (Ti) of the first region, and the atomic concentration of the titanium (Ti) of the fourth region is equal to or more than ten times the atomic concentration of the titanium (Ti) of the third region.

3. The semiconductor memory device according to claim 1, wherein the atomic concentration of the titanium (Ti) of the second region is equal to or more than $1 \times 10^{17}$ cm$^{-3}$, and the atomic concentration of the titanium (Ti) of the fourth region is equal to or more than $1 \times 10^{17}$ cm$^{-3}$.

4. The semiconductor memory device according to claim 1, further comprising an insulating layer provided between the third electrode and the fourth electrode in the first direction, the insulating layer being in contact with the third electrode and the fourth electrode, and a material of the insulating layer being different from a material of the second capacitor insulating film.

5. The semiconductor memory device according to claim 1, further comprising a substrate, wherein the first capacitor insulating film is provided between the substrate and the second capacitor insulating film.

6. The semiconductor memory device according to claim 1, wherein the first electrode, the second electrode, the third electrode, and the fourth electrode contain nitrogen (N).

7. The semiconductor memory device according to claim 1, wherein the first capacitor insulating film and the second capacitor insulating film contain oxygen (O).

8. The semiconductor memory device according to claim 1, wherein the first capacitor insulating film and the second capacitor insulating film contain at least one metal element selected from a group consisting of zirconium (Zr), hafnium (Hf), aluminum (Al), yttrium (Y), lanthanum (La), and tantalum (Ta).

9. The semiconductor memory device according to claim 1, further comprising a wiring layer extending in a second direction intersecting the first direction, the wiring layer electrically connected to the first conductive layer and the third conductive layer, wherein the first gate electrode and the second gate electrode extend in a third direction intersecting the first direction and the second direction.

10. The semiconductor memory device according to claim 1, wherein the first oxide semiconductor layer and the second oxide semiconductor layer contain indium (In) and zinc (Zn).

* * * * *